US009801253B2

(12) United States Patent
Yamamoto et al.

(10) Patent No.: US 9,801,253 B2
(45) Date of Patent: Oct. 24, 2017

(54) METHOD FOR MANUFACTURING EMISSION PANEL, AND DISPLAY DEVICE PROVIDED WITH EMISSION PANEL OBTAINED BY THE METHOD

(71) Applicant: JOLED INC., Tokyo (JP)

(72) Inventors: Hiroki Yamamoto, Kyoto (JP); Hiroyuki Yamakita, Osaka (JP); Kenichi Masumoto, Hyogo (JP)

(73) Assignee: JOLED INC., Tokyo (JP)

( * ) Notice: Subject to any disclaimer, the term of this patent is extended or adjusted under 35 U.S.C. 154(b) by 651 days.

(21) Appl. No.: 14/356,219

(22) PCT Filed: Nov. 2, 2012

(86) PCT No.: PCT/JP2012/007030
§ 371 (c)(1),
(2) Date: May 5, 2014

(87) PCT Pub. No.: WO2013/069236
PCT Pub. Date: May 16, 2013

(65) Prior Publication Data
US 2014/0320042 A1    Oct. 30, 2014

(30) Foreign Application Priority Data

Nov. 8, 2011 (JP) ................................ 2011-244392
Apr. 25, 2012 (JP) ................................ 2012-099702

(51) Int. Cl.
*H05B 33/10*    (2006.01)
*G09G 3/3233*    (2016.01)
(Continued)

(52) U.S. Cl.
CPC ........... *H05B 33/10* (2013.01); *G09G 3/3233* (2013.01); *H05B 33/0896* (2013.01);
(Continued)

(58) Field of Classification Search
CPC .. H05B 33/0896; H05B 33/10; G09G 3/3233; G09G 2360/147; G09G 2320/0295;
(Continued)

(56) References Cited

U.S. PATENT DOCUMENTS 5,696,527 A * 12/1997 King ........................ G09G 5/14
345/634
7,071,635 B2    7/2006 Inoue et al.
(Continued)

FOREIGN PATENT DOCUMENTS

JP    2002-198172    7/2002
JP    2003-323979    11/2003
(Continued)

OTHER PUBLICATIONS

Search report from PCT/JP2012/007030, dated Feb. 5, 2013.

*Primary Examiner* — Amare Mengistu
*Assistant Examiner* — Gloryvid Figueroa-Gibson
(74) *Attorney, Agent, or Firm* — Greenblum & Bernstein, P.L.C.

(57) ABSTRACT

A method for manufacturing an emission panel which has an emission portion including pixels, through which currents of mutually different values flow under a condition that voltages of mutually identical values are applied to the respective pixels is disclosed. This manufacturing method includes: an acquisition step of acquiring correction coefficients for correcting the values of the voltages applied to the respective pixels to reduce differences among the values in current flowing through the respective pixels; and an aging step of executing aging processing on the pixels, the aging processing being executed by correcting the values of the voltages applied to the respective pixels using the correction coefficients and by applying the corrected voltages to the respective pixels.

13 Claims, 25 Drawing Sheets

(51) Int. Cl.
*H05B 33/08* (2006.01)
*H01L 27/32* (2006.01)

(52) U.S. Cl.
CPC ............... *G09G 2320/0285* (2013.01); *G09G 2320/0295* (2013.01); *G09G 2320/045* (2013.01); *G09G 2360/145* (2013.01); *G09G 2360/147* (2013.01); *H01L 27/3244* (2013.01)

(58) Field of Classification Search
CPC ....... G09G 2320/045; G09G 2360/145; G09G 2320/0285; H01L 27/3244
USPC .................................. 345/76–78, 87–90, 690
See application file for complete search history.

(56) References Cited

U.S. PATENT DOCUMENTS

| | | | | |
|---|---|---|---|---|
| 2003/0122813 A1* | 7/2003 | Ishizuki | ............... | G09G 3/3233 345/211 |
| 2003/0184503 A1* | 10/2003 | Ohshita | ................. | G09G 3/006 345/76 |
| 2004/0183483 A1 | 9/2004 | Inoue et al. | | |
| 2009/0109142 A1* | 4/2009 | Takahara | ............... | G09G 3/006 345/76 |
| 2009/0207106 A1* | 8/2009 | Mizukoshi | ........... | G09G 3/3233 345/76 |
| 2010/0141640 A1 | 6/2010 | Furuie | | |
| 2011/0205221 A1* | 8/2011 | Lin | ...................... | G09G 3/2092 345/213 |

FOREIGN PATENT DOCUMENTS

| | | |
|---|---|---|
| JP | 2006-195030 | 7/2006 |
| JP | 2007-103068 | 4/2007 |
| JP | 2009-193037 | 8/2009 |
| JP | 2010-085795 | 4/2010 |
| JP | 2010-135685 | 6/2010 |
| JP | 2013-97016 | 5/2013 |
| WO | 03/027999 | 4/2003 |

* cited by examiner

FIG. 10

| K1<br>(PB1) | K2<br>(PB2) | K3<br>(PB3) | K4<br>(PB4) |
|---|---|---|---|
| K5<br>(PB5) | K6<br>(PB6) | K7<br>(PB7) | K8<br>(PB8) |
| K9<br>(PB9) | K10<br>(PB10) | K11<br>(PB11) | K12<br>(PB12) |
| K13<br>(PB13) | K14<br>(PB14) | K15<br>(PB15) | K16<br>(PB16) |

432

METHOD FOR MANUFACTURING EMISSION PANEL, AND DISPLAY DEVICE PROVIDED WITH EMISSION PANEL OBTAINED BY THE METHOD

TECHNICAL FIELD

The present invention relates to a method of manufacturing an emission panel, and a display device provided with the emission panel obtained by the method.

BACKGROUND ART

Various display devices including an emission panel that emits image light have been developed. An emission panel using emission elements emits light to display an image. Luminous efficiency of an emission element such as an organic EL (electro luminescence) element is known to change with time. Patent Document 1 discloses aging techniques for reducing such change with time in the luminous efficiency.

The aging techniques disclosed in Patent Document 1 performs, in an emission panel including display regions that are divided according to a frequency of display, aging processing based on currents of a current density different for each display region.

Patent Document 1: Japanese Patent Application Publication No. 2007-103068

SUMMARY OF THE INVENTION

Techniques of lighting the entire emission elements to perform aging of the emission panel is also known. In this case, positional variation in the aging level may happen to the emission portion. In other words, an excessively aged region and an insufficiently aged region may happen to the emission portion.

Techniques for moderating the positional variation in the aging level is provided according to the exemplary embodiments disclosed below.

The exemplary embodiments disclosed below relate to a method for manufacturing an emission panel which has an emission portion including pixels, through which currents of mutually different values flow under a condition that voltages of mutually identical values are applied to the respective pixels. The manufacturing method includes: an acquisition step of acquiring correction coefficients for correcting the values of the voltages applied to the respective pixels to reduce differences among the values in current flowing through the respective pixels; and an aging step of executing aging processing on the pixels, the aging processing being executed by correcting the values of the voltages applied to the respective pixels using the correction coefficients and by applying the corrected voltages to the respective pixels.

The technology according to the exemplary embodiments disclosed below moderates the positional variation in the aging level.

BRIEF DESCRIPTION OF THE DRAWINGS

FIG. 10 is an exemplary diagram of a correction coefficient table.

DESCRIPTION OF EMBODIMENTS

Figure 1:
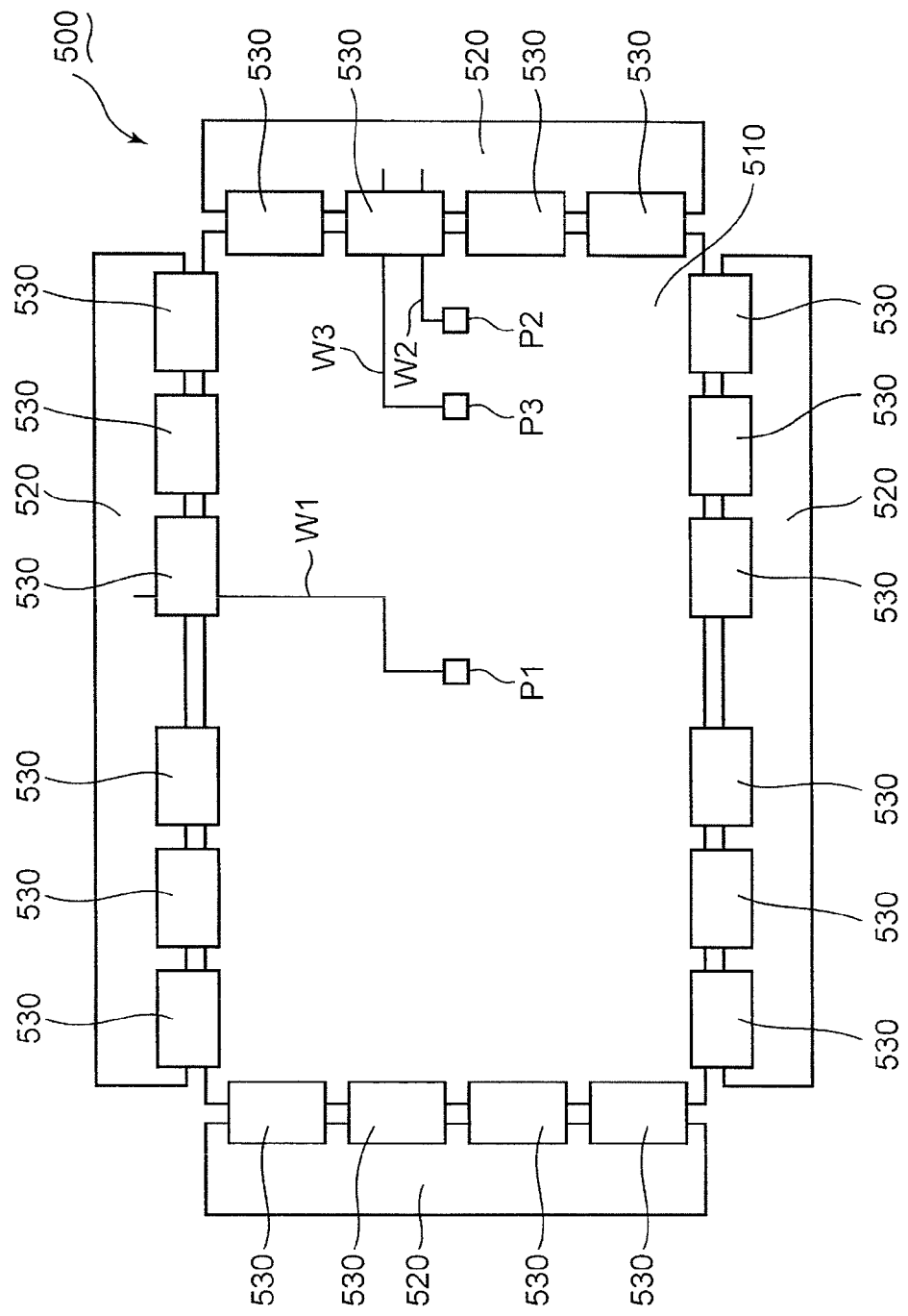
FIG. 1 is a schematic plan view of an emission panel.

An exemplary manufacturing method of an emission panel is now described with reference to the drawings. Note that, in the various embodiments described below, the same reference numeral is assigned to the same constituent element. Moreover, in order to clarify the description, redundant description is omitted as needed. Configurations, arrangements, and shapes illustrated in the drawings and the descriptions related to the drawings are provided simply to make the principle of the manufacturing method of an emission panel easily understood. Accordingly, the principle of the manufacturing method of an emission panel is not in any way limited thereby.

<Problems Related to Aging Processing>

FIG. 1 is a schematic plan view of an emission panel 500. The emission panel 500 is now described with reference to FIG. 1.

The emission panel 500 includes a substantially rectangular emission portion 510 that displays an image, circuit boards 520 that are disposed along the four sides of the emission portion 510, and flexible boards 530 that electrically connect the emission portion 510 and the circuit boards 520. The circuit board 520 generates drive signals for driving the emission portion 510. The drive signals are input to the emission portion 510 via the flexible boards 530. The emission portion 510 emits light in response to the drive signals to display images. The emission portion 510 includes pixels P1, P2, P3. The pixels P1, P2, P3 will be described later.

Figure 2:
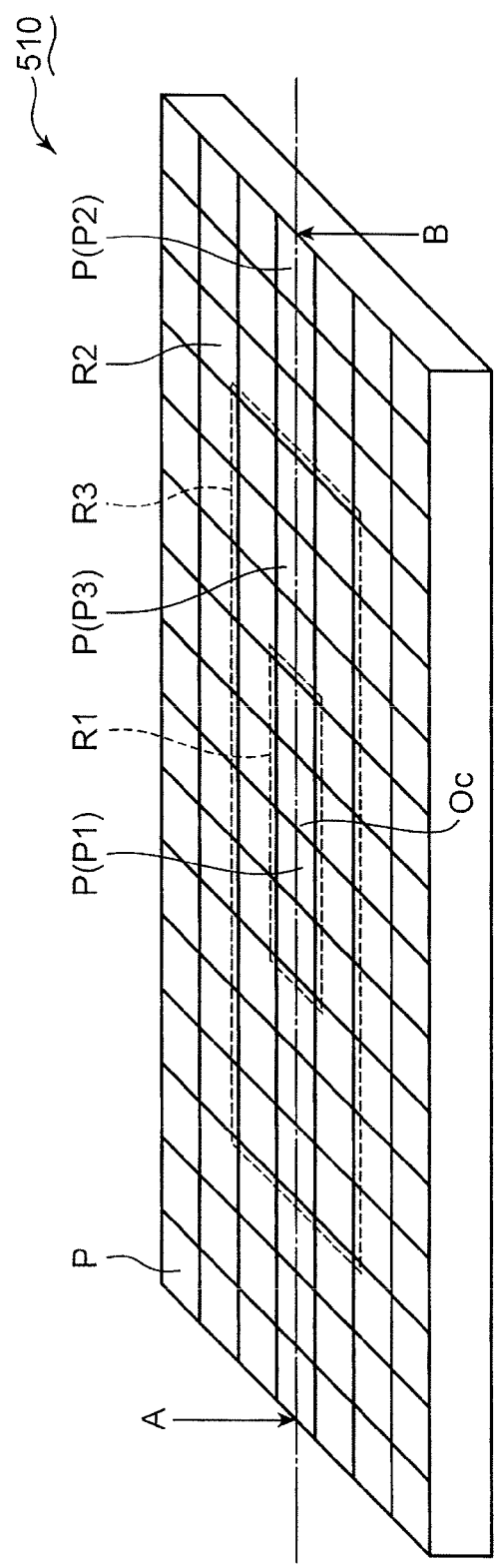
FIG. 2 is a schematic perspective view of an emission portion.

FIG. 2 is a schematic perspective view of the emission portion 510. The emission portion 510 is now described with reference to FIG. 1, FIG. 2.

Pixels P are disposed in a matrix in the emission portion 510. In FIG. 2, the pixel P1 disposed in a first region R1 including a center Oc of the emission portion 510, the pixel P2 disposed in a second region R2 that is more distant from the center Oc of the emission portion 510 than the first region R1, and the pixel P3 disposed in a third region R3 between the first region R1 and the second region R2 are specifically indicated. The pixels P include an organic EL element that emits light according to the flow of current.

During an aging processing, the entire surface of the emission portion 510 is lit in response to the drive signals from the circuit board 520. In other words, all pixels P including the pixels P1, P2, P3 emit light. Here, the inventors have figured out that there is variation in an aging level among the pixels P1, P2, P3.

Figure 3:
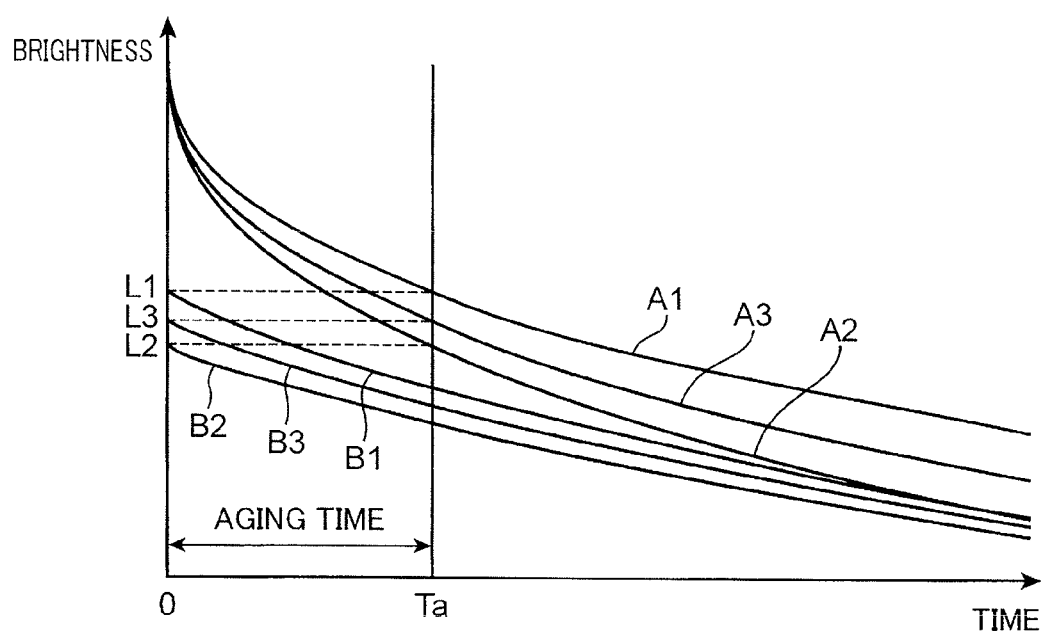
FIG. 3 is an exemplary diagram indicating a deterioration curve of pixels during an aging processing and after the aging processing.

FIG. 3 is an exemplary diagram indicating deterioration curves of the pixels P1, P2, P3 during the aging processing and after the aging processing. In FIG. 3, a deterioration curve A1 shows a transition of deterioration during the aging processing of the pixel P1. A deterioration curve A2 shows a transition of deterioration during the aging processing of the pixel P2. A deterioration curve A3 shows a transition of deterioration during the aging processing of the pixel P3. A deterioration curve B1 shows a transition of deterioration after the aging processing of the pixel P1 (that is, after the start of actual use). A deterioration curve B2 shows a transition of deterioration after the aging processing of the pixel P2 (that is, after the start of actual use). A deterioration curve B3 shows a transition of deterioration after the aging processing of the pixel P3 (that is, after the start of actual use). Variation in the aging level is now described with reference to FIG. 1 to FIG. 3.

As evident from the deterioration curves A1 A2, A3 shown in FIG. 3, after the aging processing is started at time 0, aging of the pixel P1 advances at a relatively slow pace, aging of the pixel P2 advances at a relatively fast pace, and the rate of progress of aging of the pixel P3 is between those of the pixels P1, P2. Thus, upon comparing the brightnesses L1, L2, L3 of the pixels P1, P2, P3 at the end of aging after the lapse of a predetermined aging time Ta, the result is L1>L3>L2, and there is variation in the rate of progress of aging (deterioration rate).

Consequently, as evident from the deterioration curves B1, B2, B3, the emission portion 510 is used in a state where a difference in the brightness level among the pixels P1, P2, P3 still remains, when the actual use of the emission portion 510 is started at time 0 after the aging processing. Thus, brightness unevenness and color irregularity arise in the emission portion 510. The inventors have developed techniques for resolving the variation in the aging level based on the findings described below.

<Knowledge Found Out by Inventors>

The inventors have found out that the variation in the aging level occurs due to the variation in the currents that are supplied to the pixels.

Figure 4:
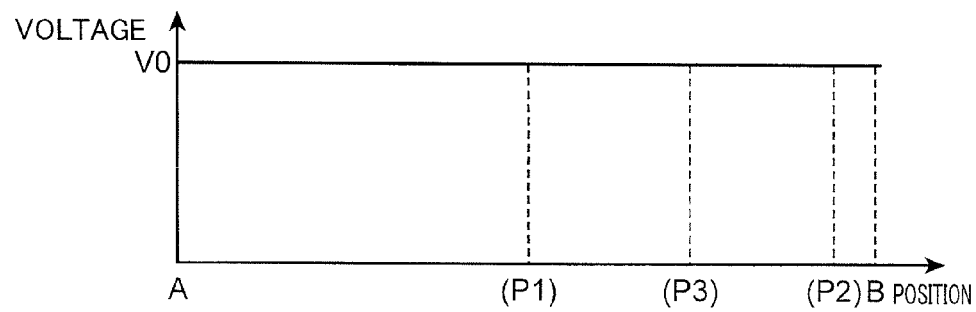
FIG. 4 is an exemplary diagram indicating a voltage applied to the respective pixels, a current supplied to the respective pixels, and a deterioration rate of the respective pixels.
Figure 4:
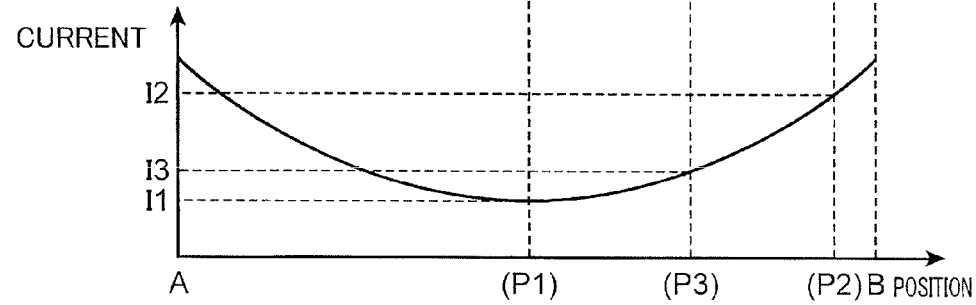
Figure 4:
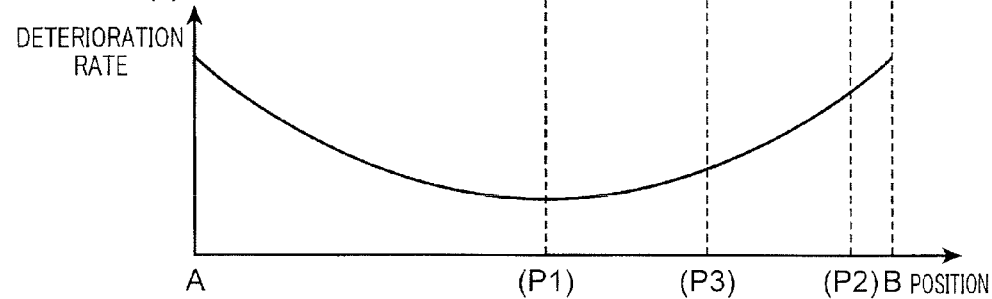

FIG. 4 is an exemplary diagram indicating voltages applied to the respective pixels, currents supplied to the respective pixels, and deterioration rates of the respective pixels. Section (a) of FIG. 4 shows voltages applied to the respective pixels. Section (b) of FIG. 4 shows currents supplied to the respective pixels. Section (c) of FIG. 4 shows deterioration rates of the respective pixels. FIG. 4 shows the foregoing items pertaining to the pixels positioned on the straight line that connects position A and position B shown in FIG. 2. Variation in the currents supplied to the pixels is now described with reference to FIG. 1 to FIG. 4.

As described above, during the aging processing, the entire surface of the emission portion 510 is lit. Here, as shown in section (a) of FIG. 4, a constant voltage V0 is applied from the circuit board 520 to the pixels positioned on the straight line connecting the position A and the position B including the pixels P1, P2, P3.

However, the inventors have figured out that, as shown in section (b) of FIG. 4, the currents that are supplied to the pixels positioned on the straight line connecting the position A and the position B decrease from the second region R2 toward the first region R1. For example, the current supplied to the pixel P1 is I1, the current supplied to the pixel P2 is I2, the current supplied to the pixel P3 is I3, and the result is I1<I3<I2. The inventors have further figured out that, as shown in section (c) of FIG. 4, the deterioration rate (rate of progress of aging) becomes varied in accordance with the foregoing variation in the currents. The inventors have assumed the cause of the foregoing phenomenon to be as follows.

Conducting wires that connect the circuit boards 520 and the respective pixels are wired from a periphery of the emission portion 510 to the respective pixels inside the emission portion 510 via the flexible boards 530. Accordingly, with the pixels P1, P2, P3, for example, as shown in FIG. 1, a conducting wire W1 to the pixel P1 disposed in the first region R1 of the emission portion 510 is the longest, a conducting wire W2 to the pixel P2 disposed in the second region R2 of the emission portion 510 is the shortest, and a length of a conducting wire W3 to the pixel P3 disposed in the third region R3 is a value that is between those of the conducting wires W1, W2. Consequently, as shown in section (b) of FIG. 4, the currents supplied to the pixels decrease as the conducting wire connecting the circuit board 520 and the pixel becomes longer, that is, from the second region R2 toward the first region R1. In this embodiment, the pixel P1 is exemplified as the first pixel, the pixel P2 is exemplified as the second pixel, the conducting wire W1 is exemplified as the first conducting wire, and the conducting wire W2 is exemplified as the second conducting wire.

Based on the findings described above, the inventors have devised the various embodiments described below.

<First Embodiment>

Figure 5:
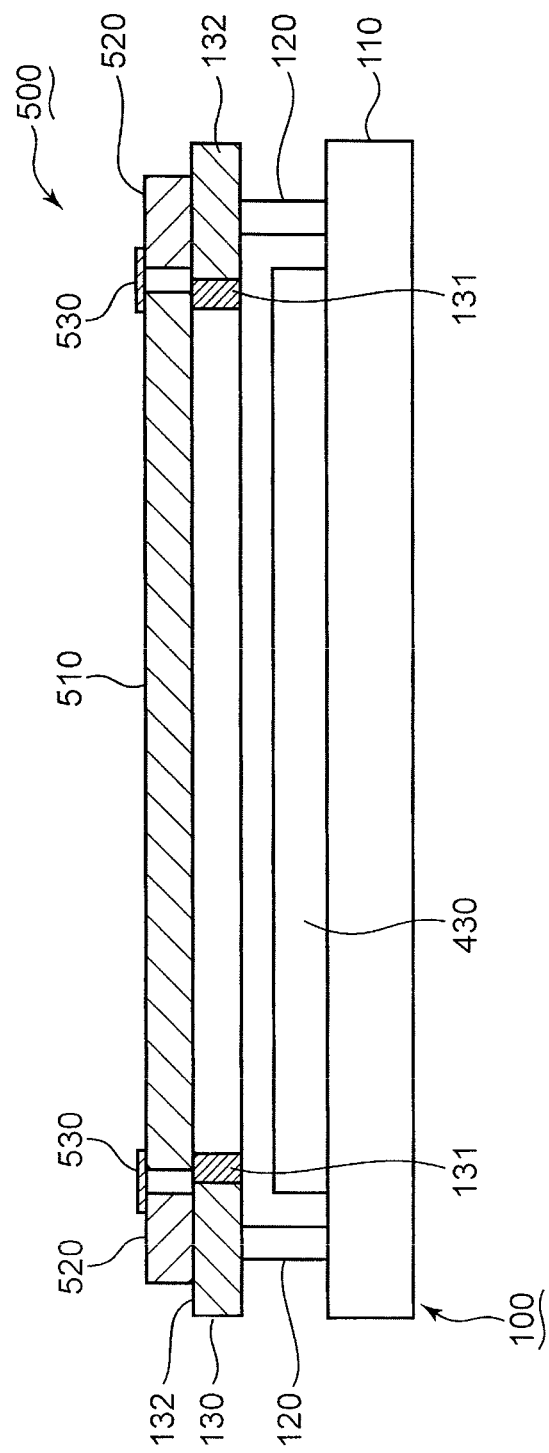
FIG. 5 is a schematic cross section of the emission panel.

FIG. 5 is a schematic cross section of an emission panel 500. An aging processing performed to the emission panel 500 is now described with reference to FIGS. 2, 5.

A support 100 is prepared for performing aging processing to the emission panel 500. The emission panel 500 is subject to the aging processing on the support 100.

The support 100 includes a pedestal 110, legs 120 that are erected from the pedestal 110, and a supporting frame 130 built on the legs 120. The supporting frame 130 includes inner frames 131 for supporting peripheral edges of the emission portion 510, and outer frames 132 that surround the inner frames 131. The circuit boards 520 are supported by the outer frames 132.

The outer frame 132 is made of a highly thermal conductive material such as metal or a carbon graphite sheet. While the aging processing is performed based on the emission of the respective pixels P, the circuit boards 520 generate heat. The heat from the circuit boards 520 is efficiently transmitted to the outer frames 132. Since the outer frames 132 possess high thermal conductivity, the heat transmitted from the circuit board 520 is conducted throughout the outer frames 132. Consequently, the outer frames 132 may efficiently radiate heat.

The inner frames 131 are made of a material with superior thermal insulation properties such as glass fiber or cement or mica. Accordingly, the inner frames 131 block much of the flow of heat between the emission portion 510 and the outer frames 132. Accordingly, the emission portion 510 is not easily affected by the heat transmitted to the outer frames 132.

A control panel 430 is prepared for adjusting the voltages that are applied to the respective pixels P of the emission portion 510 from the circuit board 520. The control panel 430 is disposed on the pedestal 110 of the support 100.

Figure 6:
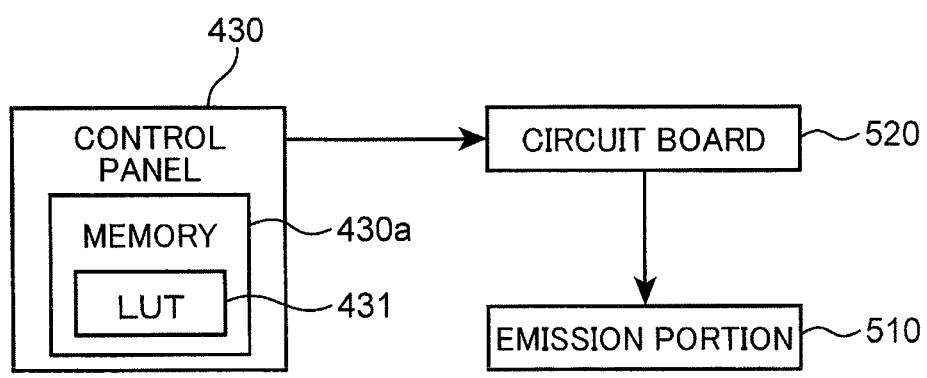
FIG. 6 is a block diagram showing a control configuration of an aging device to execute the aging processing.
Figure 7A:
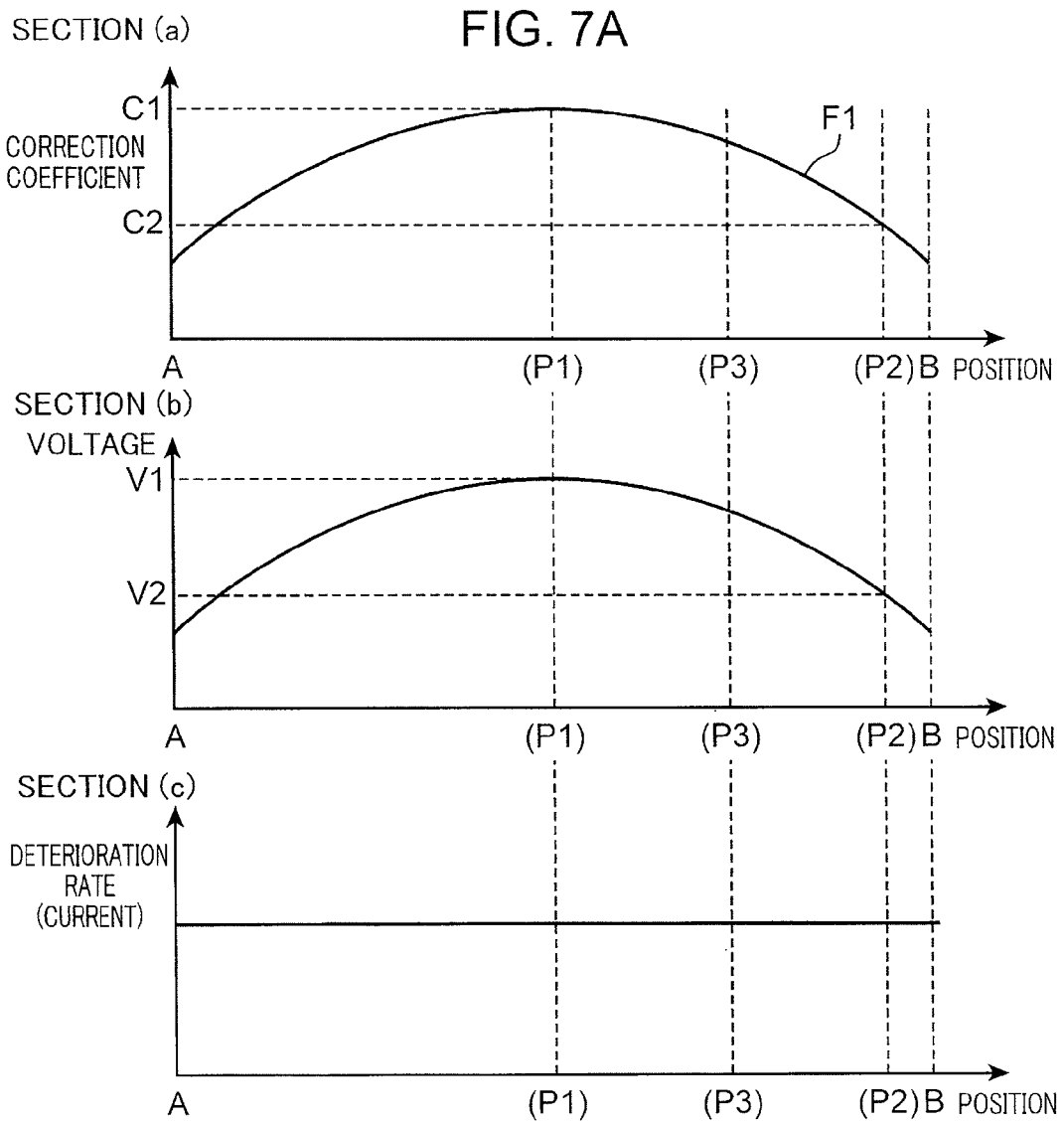
FIG. 7A is an exemplary diagram indicating a correction coefficient of the respective pixels, the voltage applied to the respective pixels, and the deterioration rate of the respective pixels.
Figure 7B:
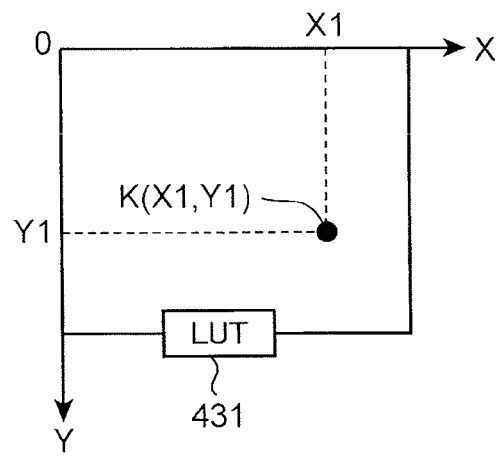
FIG. 7B is an exemplary diagram indicating a look-up table.

FIG. 6 is a block diagram showing a control configuration of the aging device to execute the aging processing. FIG. 7A is an exemplary diagram indicating correction coefficients of the respective pixels, voltages to be applied to the respective pixels, and deterioration rates of the respective pixels. Section (a) of FIG. 7A shows correction coefficients of the respective pixels. Section (b) of FIG. 7A shows voltages applied to the respective pixels. Section (c) of FIG. 7A shows deterioration rates of the respective pixels. FIG. 7B is an exemplary diagram indicating a look-up table. FIG. 7A shows the foregoing items pertaining to the pixels positioned on the straight line that connects the position A and the position B shown in FIG. 2. Correction of the applied voltage is now described with reference to FIGS. 2, 4, 6, 7A and 7B.

As described with reference to section (b) of FIG. 4, the currents that are supplied to the pixels positioned on the straight line connecting the position A and the position B decrease from the second region R2 toward the first region R1. Thus, as shown in section (a) of FIG. 7A, the correction coefficients of the pixels positioned on the straight line connecting the position A and the position B increases from the second region R2 toward the first region R1. For example, a correction coefficient C1 of the pixel P1 and a correction coefficient C2 of the pixel P2 are set to C1>C2. The correction coefficients are calculated, for example, by multiplying the quotient obtained by dividing the constant voltage V0 shown in section (a) of FIG. 4 by the current value shown in section (b) of FIG. 4, by an appropriate coefficient.

By means of the correction coefficients shown in section (a) of FIG. 7A, the voltages applied to the pixels positioned on the straight line connecting the position A and the position B increase from the second region R2 toward the first region R1 as shown in section (b) of FIG. 7A. For example, a voltage V1 is applied to the pixel P1, a voltage V2 is applied to the pixel P2, and a level relation of the voltages is V1>V2. Thus, as shown in section (c) of FIG. 7A, the deterioration rates of the respective pixels (that is, the currents supplied to the respective pixels) are the same. Consequently, variation in the aging level of the respective pixels is resolved.

The control panel 430 includes a memory 430a. The memory 430a is, for example, a non-volatile memory, and stores a look-up table (LUT) 431. The LUT 431 represents the correction coefficients of the application voltages to the respective pixels P. As shown in FIG. 7B, the LUT 431 is a table in which the position (X, Y) of each of the pixels P in the emission portion 510 is associated with the correction coefficient. FIG. 7B shows a correction coefficient K (X1, Y1) of the pixel at a position (X1, Y1).

The control panel 430 extracts the correction coefficient K corresponding to the position (X, Y) of the pixel P in the emission portion 510 from the LUT 431. The control panel 430 applies the voltage obtained by multiplying the extracted correction coefficient K by the constant voltage V0 to the pixel P. In this embodiment, the LUT 431 is exemplified as the table data.

Figure 8:
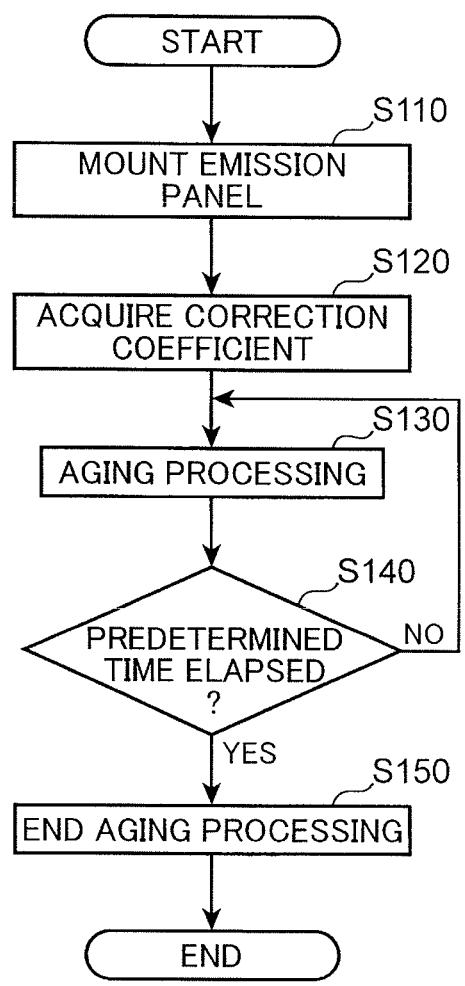
FIG. 8 is a schematic flowchart of a manufacturing method of the emission panel.

FIG. 8 is a schematic flowchart of a manufacturing method of the emission panel 500. The manufacturing method of the emission panel 500 is now described with reference to FIG. 1 to FIG. 8.

(Step S110)

In step S110, as described with reference to FIG. 5, the emission panel 500 is mounted on the support 100. After the emission panel 500 is mounted on the support 100, step S120 is executed.

(Step S120)

In step S120, as described with reference to FIG. 6, the correction coefficients are acquired from the LUT 431. Step S130 is executed subsequent to step S120. In this embodiment, step S120 is exemplified as the acquisition step.

(Step S130)

In step S130, the circuit boards 520 output voltages corrected by the control panel 430 to the emission portion 510 as drive signals. Consequently, the emission portion 510 of the emission panel 500 emits light. Since the entire surface of the emission portion 510 of the emission panel 500 is lit, aging processing progresses. Step S140 is executed subsequent to step S130. In this embodiment, step S130 is exemplified as the aging step.

(Step S140)

In step S140, the control panel 430 judges whether a predetermined time has elapsed from a start of the aging processing (step S130). When the control panel 430 judges that a predetermined time has not elapsed (step S140: NO), step S130 is executed once again. Meanwhile, when the control panel 430 judges that a predetermined time has elapsed (step S140: YES), step S150 is executed.

(Step S150)

In step S150, the aging processing is ended, and the operation shown in FIG. 8 is ended.

Figure 9:
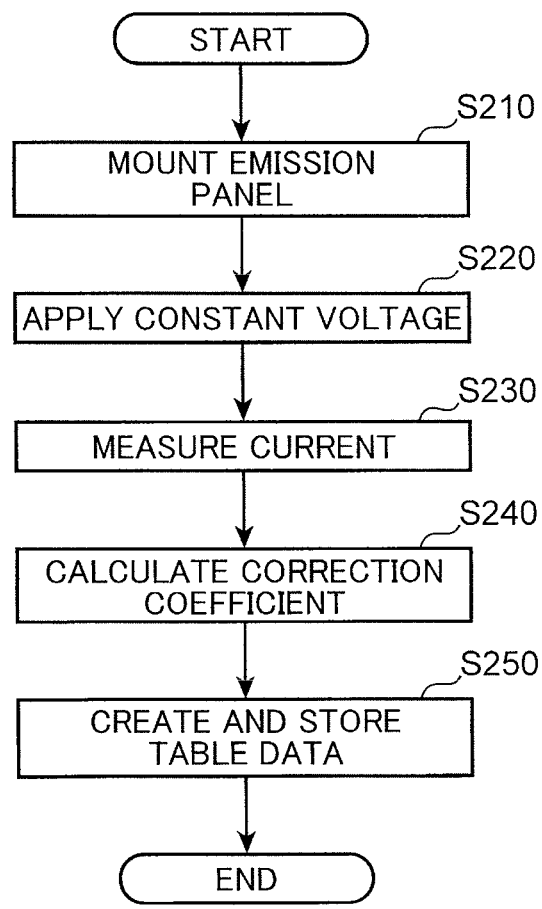
FIG. 9 is an exemplary flowchart of a routine for calculating the correction coefficient.

FIG. 9 is an exemplary flowchart of a routine for calculating the correction coefficients. The calculation routine of the correction coefficients is now described with reference to FIG. 2, FIGS. 4, 7A, 7B and 9.

(Step S210)

In step S210, as described with reference to FIG. 5, the emission panel 500 is mounted on the support 100. After the emission panel 500 is mounted on the support 100, step S220 is executed.

(Step S220)

In step S220, as described with reference to section (a) of FIG. 4, a constant voltage V0 is applied from the circuit boards 520 to the respective pixels P of the emission portion 510. Step S230 is executed subsequent to step S220.

(Step S230)

In step S230, currents flowing through the respective pixels P are measured by the control panel 430. For example, a measurement value I1 of the current of the pixel P1 is obtained, and a measurement value I2 of the current of the pixel P2 is obtained. Step S240 is executed subsequent to step S230. In this embodiment, step S230 is exemplified as the first step of the calculation step, and the constant voltage V0 is exemplified as the reference voltage.

(Step S240)

In step S240, the correction coefficients are calculated by the control panel 430 based on the constant voltage V0 applied in step S220 and the currents of the respective pixels P measured in step S230. For example, a correction coefficient C1 of the pixel P1 is obtained, and a correction coefficient C2 of the pixel P2 is obtained. Step S250 is executed subsequent to step S240. In this embodiment, step S240 is exemplified as the second step of the calculation step.

(Step S250)

In step S250, table data is created by the control panel 430 based on the correction coefficients calculated in step S240 and the positions of the respective pixels, and is stored as the LUT 431 in the memory 430a. The operation of FIG. 9 is thereby ended. In this embodiment, step S250 is exemplified as the third step of the calculation step.

The operation shown in FIG. 9 may also be executed for each emission panel 500. In this case, subsequent to the operation of FIG. 9, the operation may be executed from step S120 of FIG. 8. Alternatively, the operation shown in FIG. 9 may also be executed only once for the emission panels 500 having the same specification. In this case, the aging processing may be executed promptly by using the same correction coefficient table stored as the LUT 431 in the memory 430a with regard to the respective emission panels 500.

As described above, the LUT 431 includes a correction coefficient table of the application voltages to the respective pixels P in this embodiment. Alternatively, the LUT 431 may include a correction coefficient table for each pixel block of pixels (3×3=9 pixels, for instance).

FIG. 10 is an exemplary diagram of a correction coefficient table 432. As shown in FIG. 10, correction coefficients K1 to K16 are respectively set for pixel blocks PB1 to PB16. With the mode shown in FIG. 10, currents of all pixels (3×3=9 pixels, for instance) of the pixel block may be measured, and an average value thereof may be used as a measurement value of the pixel block, in step S230. Alternatively, only a current of a representative pixel (center pixel of 3×3 pixels, for instance) of the pixel block may be measured, and a measurement value thereof may be used as the measurement value of the pixel block. In this embodiment, the correction coefficient table 432 is exemplified as the table data.

With the mode shown in FIG. 10, the control panel 430 may correct an application voltage for each pixel block. Alternatively, the control panel 430 may interpolate the correction coefficients for the respective pixel blocks to calculate the correction coefficient for each pixel, and correct the application voltage for each pixel.

<Second Embodiment>

Figure 11:
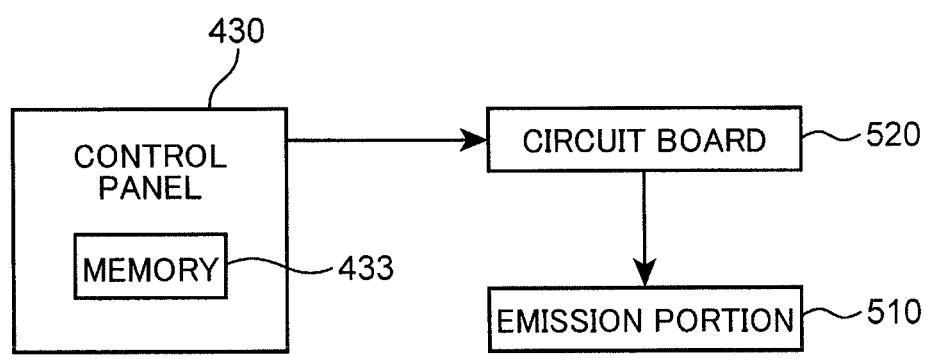
FIG. 11 is a block diagram showing a control configuration of the aging device to execute the aging processing.
Figure 12:
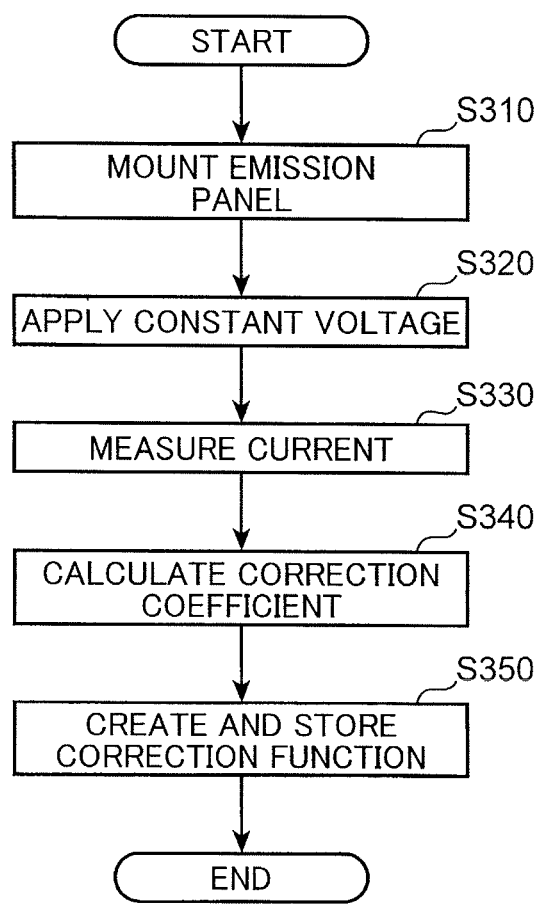
FIG. 12 is an exemplary flowchart of the routine for calculating the correction coefficient.

FIG. 11 is a block diagram showing a control configuration of an aging device to execute the aging processing. FIG. 12 is an exemplary flowchart of a routine for calculating correction coefficients. The calculation routine of the correction coefficients is now described with reference to FIGS. 2, 11 and 12.

The control panel 430 includes a memory 433 configured from, for example, a non-volatile memory. The memory 433 stores a correction function F (X, Y) representing correction coefficients of application voltages to the respective pixels. The correction function F (X, Y) represents a correction coefficient of a position (X, Y) of each of the pixels. For example, when a position of a pixel P2 is (X2, Y2), F (X2, Y2) represents a correction coefficient of the pixel P2. For example, a correction function F1 shown in section (a) of FIG. 7A represents correction coefficients of the pixels positioned on the straight line connecting the positions A, B (FIG. 2). The control panel 430 calculates a correction coefficient of a position (Xp, Yp) relative to the pixel P from the correction function F (X, Y) of the memory 433 as F (Xp, Yp). The control panel 430 applies voltages whose values are obtained by multiplying the calculated correction coefficients by the constant voltage V0 to the pixels P.

(Step S310)

In step S310, as described with reference to FIG. 5, the emission panel 500 is mounted on the support 100. After the emission panel 500 is mounted on the support 100, step S320 is executed.

(Step S320)

In step S320, as described with reference to section (a) of FIG. 4, a constant voltage V0 is applied from the circuit boards 520 to the respective pixels P of the emission portion 510. Step S330 is executed subsequent to step S320.

(Step S330)

In step S330, currents flowing through the respective pixels are measured by the control panel 430. Step S340 is executed subsequent to step S330. In this embodiment, step S330 is exemplified as the first step of the calculation step.

(Step S340)

In step S340, correction coefficients are calculated by the control panel 430 based on the constant voltage applied in step S320 and the currents of the respective pixels P measured in step S330. Step S350 is executed subsequent to step S340. In this embodiment, step S340 is exemplified as the second step of the calculation step.

(Step S350)

In step S350, correction function F (X, Y) representing the correction coefficients of the respective pixels is created by the control panel 430 based on the correction coefficients calculated in step S340 and positions of the respective pixels, stored in the memory 433. The operation of FIG. 12 is thereby ended. The correction function F (X, Y) is created, for example, as a function that represents a curve that best satisfies the correction coefficients of the respective pixels (X, Y) of the emission portion 510. In this embodiment, step S350 is exemplified as the third step of the calculation step.

As described above, the memory 433 stores the correction function representing the correction coefficients of the application voltages to the respective pixels P in this embodiment. Alternatively, the memory 433 may also store a correction coefficient table for each pixel block, and a correction function for calculating the correction coefficient for each pixel from the correction coefficient table. In this embodiment and mode, it is possible to reduce a capacity required for the memory in comparison to the LUT 431.

<Third Embodiment>

Figure 13:
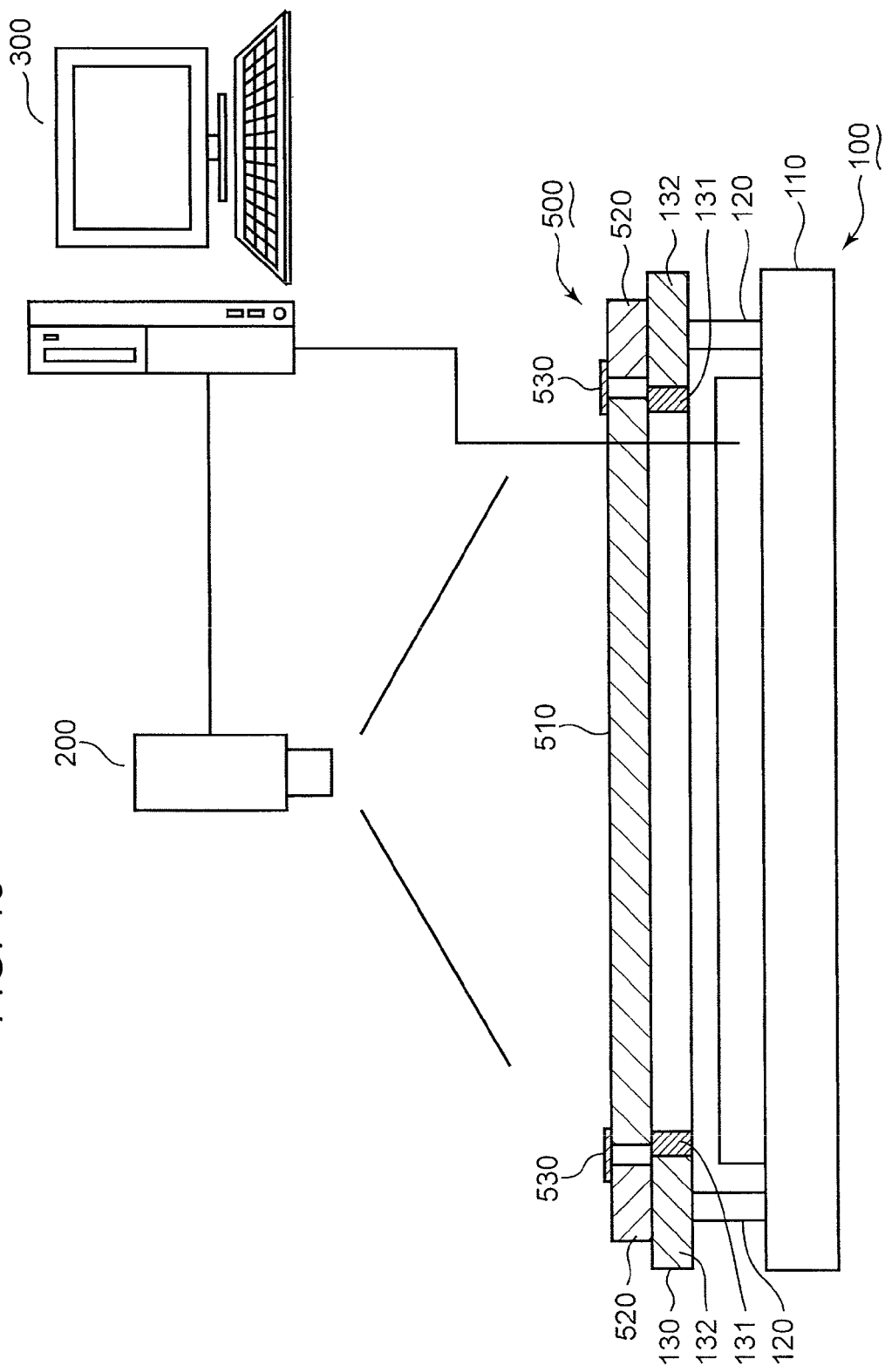
FIG. 13 is a schematic cross section of the emission panel.

FIG. 13 is a schematic cross section of an emission panel 500. An aging processing performed to the emission panel 500 is now described with reference to FIGS. 2, 13.

A support 100 is prepared for performing aging processing to the emission panel 500. The emission panel 500 is subject to the aging processing on the support 100. A brightness meter 200 for measuring brightness distribution of the emission panel 500 on the support 100 and a computer 300 for processing brightness data acquired by the brightness meter 200 are prepared. Circuit boards 520 output to the emission portion 510 via flexible boards 530, drive signals for causing the respective pixels of the emission portion 510 to emit light. The control panel 430 is electrically connected to the computer 300. The computer 300 outputs the brightness data measured by the brightness meter 200 to the control panel 430.

As a result of the drive signals being output from the circuit board 520, the entire surface of the emission panel 500 is lit. A constant voltage V0 is applied to all pixels P of the emission portion 510 in response to the drive signals generated by the circuit board 520. However, actual brightness measured by the brightness meter 200 fluctuates based on the currents supplied to the respective pixels P.

Figure 14:
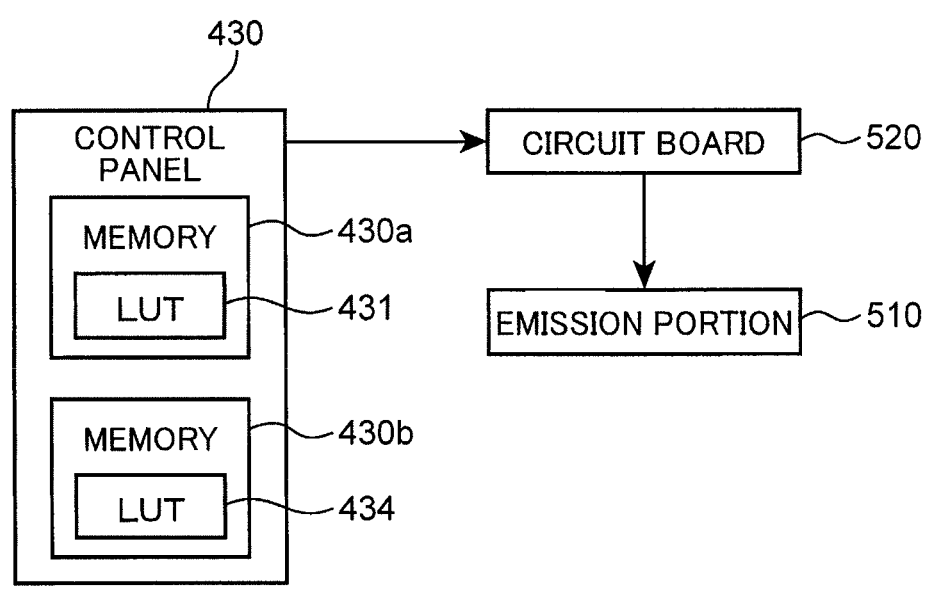
FIG. 14 is a block diagram showing a control configuration of the aging device to execute the aging processing.
Figure 15:
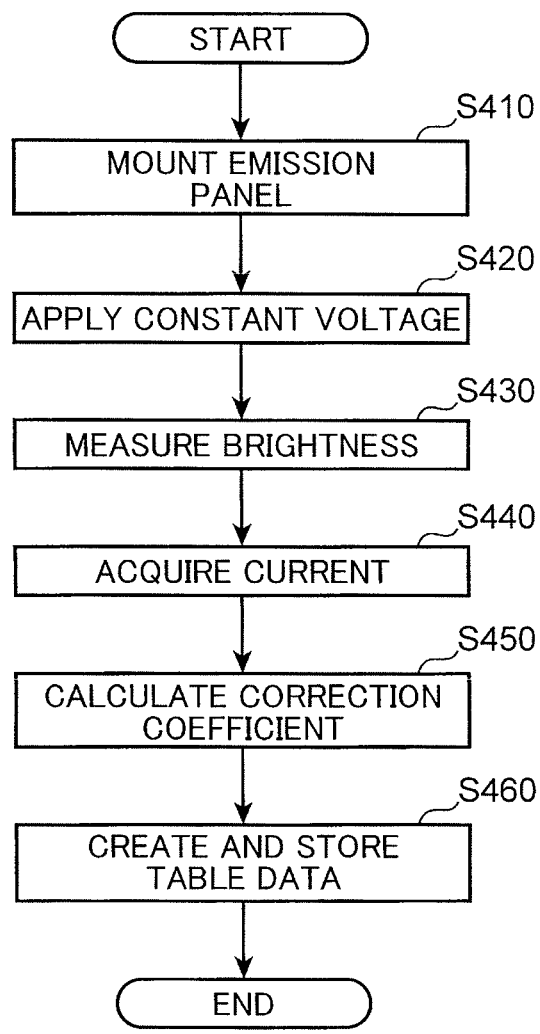
FIG. 15 is an exemplary flowchart of the routine for calculating the correction coefficient.

FIG. 14 is a block diagram showing a control configuration of the aging device to execute the aging processing. FIG. 15 is an exemplary flowchart of a routine for calculating the correction coefficients. The calculation routine of the correction coefficients is now described with reference to FIGS. 2, 14 and 15.

The control panel 430 includes a memory 430b. The memory 430b is, for example, a non-volatile memory, and stores an LUT 434. The LUT 434 is a table representing current efficiency as a relation between the current supplied to the pixels and the brightness of the pixels. In other words, the LUT 434 represents a relation between the brightness when the pixels P emit light, and the currents supplied to the pixels P at such time. The control panel 430 calculates the currents supplied to the respective pixels P from the brightness data of the respective pixels P output from the computer 300 and the current efficiency of the LUT 434. The control panel 430 calculates the correction coefficients based on the calculated currents and the constant voltage V0 applied from the circuit boards 520 to the respective pixels P.

(Step S410)

In step S410, as described with reference to FIG. 13, the emission panel 500 is mounted on the support 100. After the emission panel 500 is mounted on the support 100, step S420 is executed.

(Step S420)

In step S420, as described with reference to section (a) of FIG. 4, the constant voltage V0 is applied from the circuit boards 520 to the respective pixels P of the emission portion 510. Step S430 is executed subsequent to step S420.

(Step S430)

In step S430, the brightness of the respective pixels P is measured by the brightness meter 200. For example, a measurement value L11 of the brightness of the pixel P1 is obtained, and a measurement value L12 of the brightness of the pixel P2 is obtained. Step S440 is executed subsequent to step S430. In this embodiment, step S430 is exemplified as the first step of the calculation step.

(Step S440)

In step S440, currents supplied to the respective pixels P are acquired from the brightness of the respective pixels P measured in step S430 and the current efficiency stored in the LUT 434. Step S450 is executed subsequent to step S440.

(Step S450)

In step S450, correction coefficients are calculated by the control panel 430 based on the constant voltage V0 applied in step S420 and the currents supplied to the respective pixels P acquired in step S440. For example, a correction coefficient C11 of the pixel P1 is obtained, and a correction coefficient C12 of the pixel P2 is obtained. Step S460 is executed subsequent to step S450. In this embodiment, steps S440, S450 are exemplified as the second step of the calculation step.

(Step S460)

In step S460, table data is created by the control panel 430 based on the correction coefficients calculated in step S450 and the positions of the respective pixels, and is stored as the LUT 431 in the memory 430a. The operation of FIG. 15 is thereby ended. In this embodiment, step S460 is exemplified as the third step of the calculation step.

As described above, the brightness of the respective pixels P is measured in this embodiment. The brightness of the respective pixels P may be measured in a shorter time in comparison to the case of measuring the currents supplied to the respective pixels P. Thus, in this embodiment, the correction coefficients of the respective pixels P may be calculated in a short time.

The operation shown in FIG. 15 may also be executed for each emission panel 500. In this case, subsequent to the operation of FIG. 15, the operation may be executed from step S120 of FIG. 8. Alternatively, the operation shown in FIG. 15 may also be executed only once for the emission panels 500 having the same specification. In this case, the aging processing may be executed promptly by using the same correction coefficient table stored as the LUT 431 with regard to the respective emission panels 500.

In the foregoing third embodiment, while the table data of the correction coefficients is created as in the first embodiment described above, the present disclosure is not limited thereto. For example, a correction function may also be created as in the second embodiment described above.

<Fourth Embodiment>

A fourth embodiment is now described. The fourth embodiment relates to a display device that uses emission elements such as organic EL (electro luminescence) elements, and to aging techniques, that is, processing of stabilizing a change in brightness by causing the emission elements to emit light. Foremost, problems encountered in the aging techniques are described, and a configuration and the like of the fourth embodiment are described thereafter.

(Problems Encountered in Aging Techniques)

In recent years, display devices using emission elements that emit light under voltage application have been developed. In addition, organic EL display devices that use organic EL elements as the emission elements are widely utilized. Maximum brightness of the emission elements decreases pursuant to an increase in a cumulative emission time immediately after a start of emission. In addition, the maximum brightness tends to decrease steeply in an initial cumulative emission period immediately after the start of emission of the emission elements, and decrease gradually in a subsequent cumulative emission period. A life of the emission elements may be set forth as a time that the maximum brightness thereof diminishes by half from the maximum brightness immediately after shipment of the display device. In this case, if no measures are taken, the maximum brightness of the emission elements may diminish by half in a short period after shipment of the display device, and thereby may cause the emission elements to reach an end of their life.

With a standard display device, aging is performed prior to a shipment thereof. Aging is processing of causing the emission elements to emit light for a given period of time to intentionally reduce the maximum brightness thereof, and thereby stabilize a brightness variation. When aging is performed to the display device before shipment, the period in which the maximum brightness of the emission elements decreases steeply is ended at a time of shipment. Thus, the maximum brightness of the emission elements gradually decreases during an entire period after shipment. It is thereby possible to inhibit the maximum brightness of the emission elements from diminishing by half in a short period after shipment of the display device.

In addition to the problem of moderating the positional variation in the aging level described in the above first to third embodiments, there are demands for shortening an aging time in order to improve a manufacturing efficiency of the display device. In response, techniques of shortening the aging time by switching between an aging mode for aging the emission elements, and an image display mode for displaying an image using the emission elements, and causing the emission elements to emit light in different forms in the respective modes is proposed.

Figure 20:
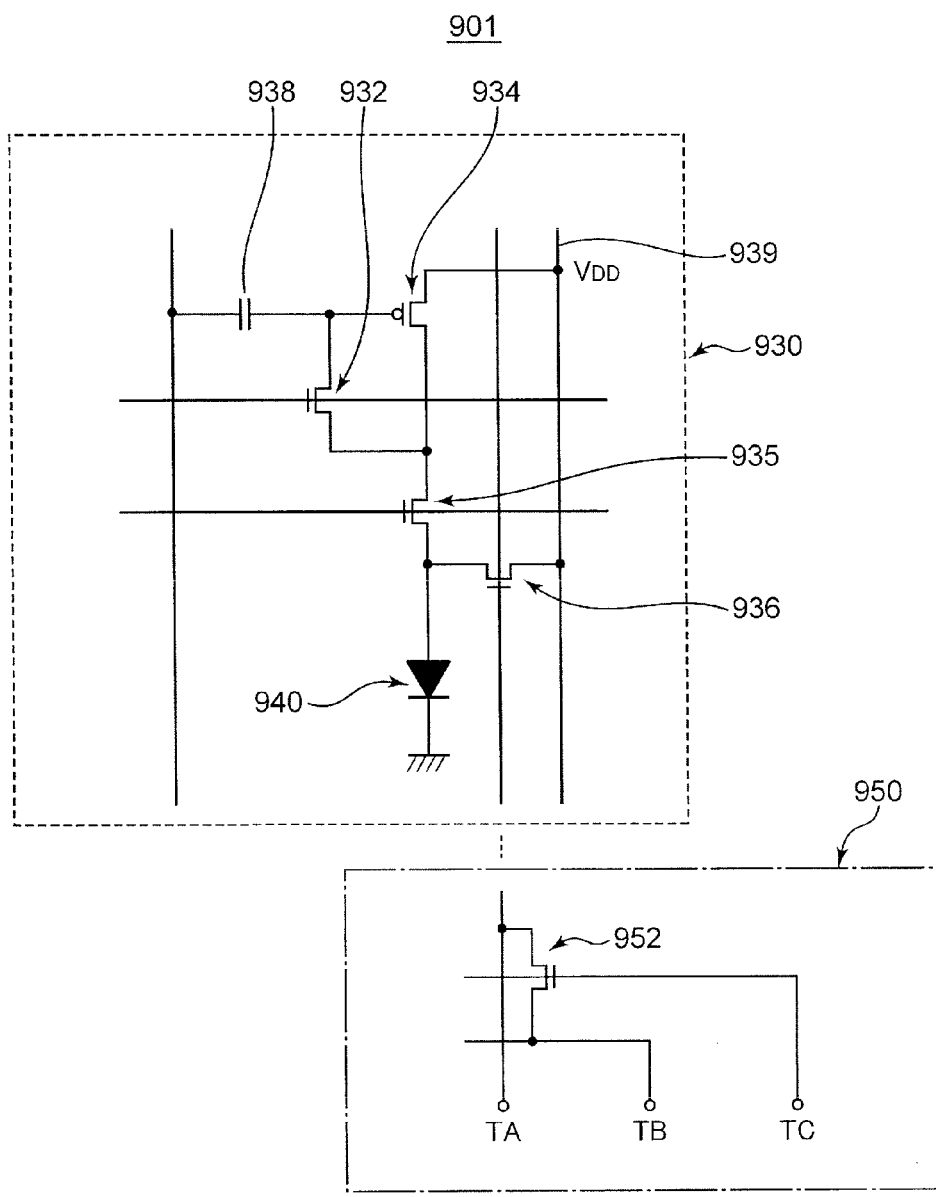
FIG. 20 is a circuit diagram of one pixel of the organic EL display device according to a conventional example.

For example, Japanese Patent Application Publication No. 2010-135685 discloses techniques of applying voltage to the emission elements from an external aging device, and causing the emission elements to emit light in an entire period of one frame. An organic EL display device disclosed in Japanese Patent Application Publication No. 2010-135685 is as shown in FIG. 20. An organic EL display device 901 includes pixel parts 930 each including a reset transistor 932, a drive transistor 934, a lighting transistor 935, a first transistor 936, a capacitor 938, a power line 939, and an emission element 940.

In the aging mode, the first transistor 936 is connected to the external aging device via an external terminal area 950 including a second transistor 952. Moreover, in the aging mode, the first transistor 936 functions to connect the power line 939 and the emission element 940 based on an operation of the external aging device.

In the image display mode, one frame includes a write period and a subsequent emission period, and the write period and the emission period are switched within one frame. In the write period, a data voltage is retained in the capacitor 938 in all pixels. In the emission period, a voltage for turning on the lighting transistor 935 is applied in all pixels, a current is caused to flow through the emission element 940, and the emission element 940 emits light to display an image.

On the other hand, in the aging mode, the entire period of one frame is the emission period. In the aging mode, the power line 939 and the emission element 940 are connected via the first transistor 936, a current is caused to flow through the emission element 940, and the emission element 940 emits light to perform aging. Thus, in the aging mode, there is no need to retain the data voltage in the capacitor 938 as in the write period under the image display mode. Accordingly, the emission period under the aging mode becomes longer than the emission period under the image display mode. Hence, in the aging mode according to this configuration, the aging time may be shortened in comparison to a case of performing the same drive as the image display mode in the aging mode.

Moreover, Japanese Patent Application Publication No. 2006-195030 discloses techniques of applying a continuous voltage to the emission elements in the organic EL display panel in the image display mode, and applying a pulsed voltage to the emission elements from the external aging device in the aging mode as shown in FIG. 11 of the foregoing Publication. The foregoing Publication describes that the aging time may be shortened since the maximum brightness of the emission elements tends to decrease more steeply when a pulsed voltage is applied to the emission elements in comparison to a case of applying a continuous voltage.

If aging is performed to the display device before shipment using an external aging device as in the conventional display devices described above, when the aging devices are all being used in the manufacturing process, it takes a long time for an aging device to become available. Moreover, aging is a process of causing the emission elements to emit light for a given period of time, and takes time. Hence, when aging is performed using an external aging device, there is a problem in that the throughput of the number of display devices that can be manufactured per unit time decreases to cause a manufacturing efficiency to deteriorate.

Thus, this embodiment provides a display device which may be capable of inhibiting deterioration in the manufacturing efficiency while shortening the aging time.

(Overall Configuration of Organic EL Display Device)

Figure 16:
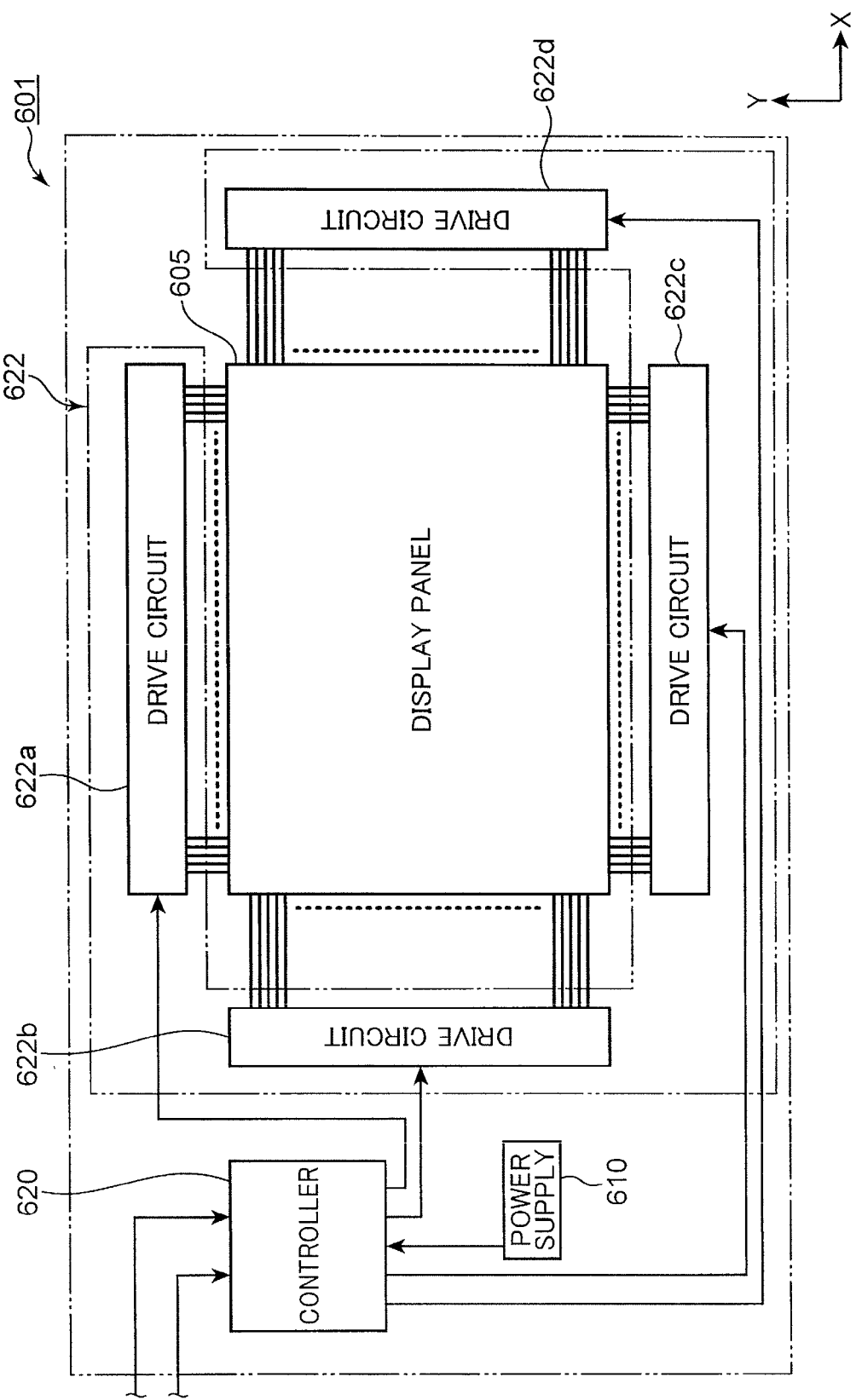
FIG. 16 is a block diagram schematically showing a schematic configuration of an organic EL display device.

FIG. 16 is a block diagram schematically showing a schematic configuration of an organic EL display device of the fourth embodiment. A configuration of an organic EL display device 601 that uses organic EL elements as emission elements according to the fourth embodiment is now described with reference to FIG. 16.

As shown in FIG. 16, the organic EL display device 601 includes an organic EL display panel 605, a power supply 610 that supplies power to circuits, a controller 620 that controls the circuits, and a drive circuit part 622. The organic EL display panel 605 is a panel that utilizes an electroluminescence phenomenon of an organic material, and the pixels are arranged, for example, in a matrix. Each pixel includes a pixel circuit and an emission element. The drive circuit part 622 includes four drive circuits 622a, 622b, 622c, 622d.

Note that an arrangement of the drive circuit part 622 relative to the organic EL display panel 605 in the organic EL display device 601 according to this embodiment is not limited to the example described above.

Figure 17:
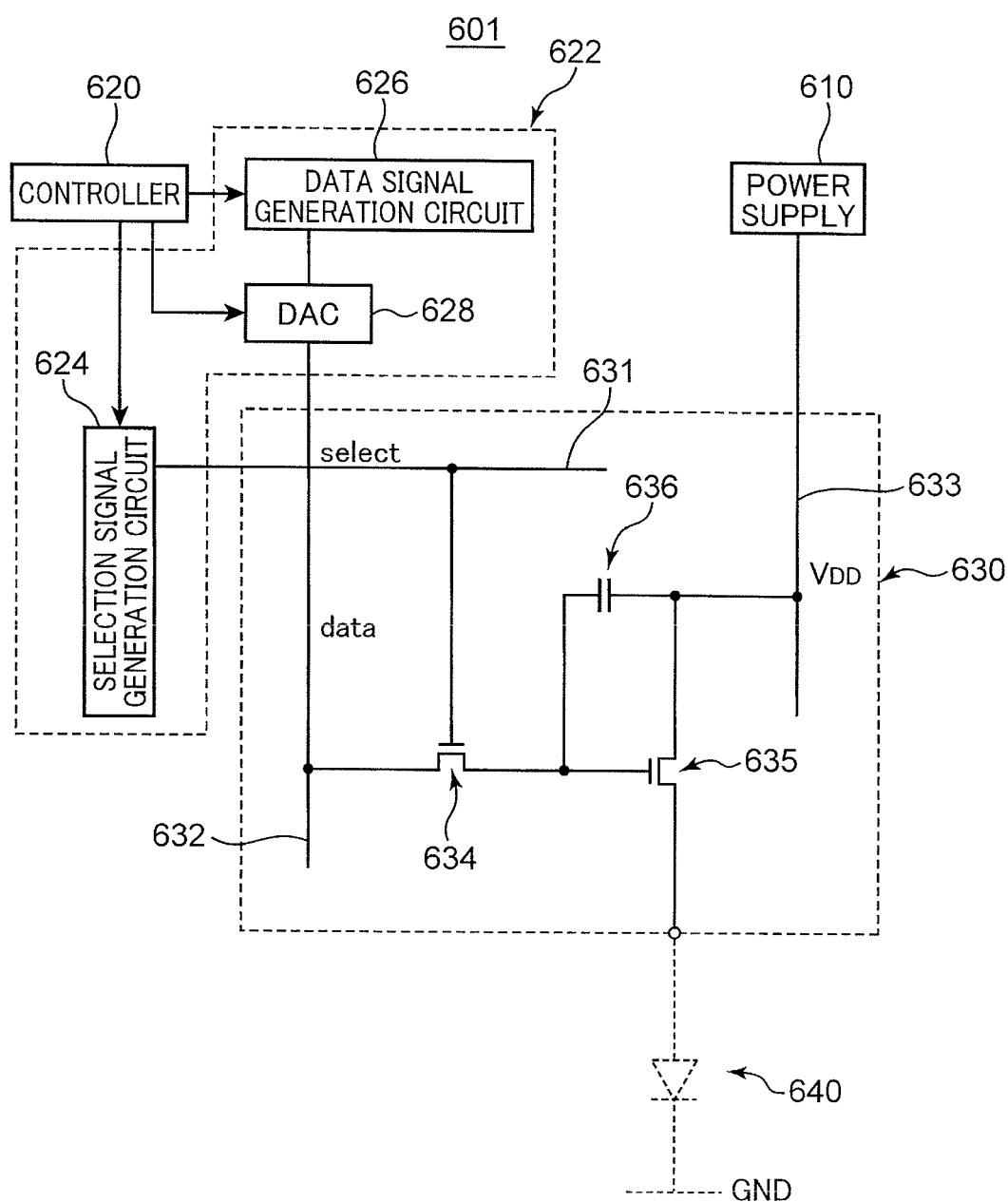
FIG. 17 is a circuit diagram of one pixel of the organic EL display device shown in FIG. 16.

FIG. 17 is a circuit diagram of one pixel of the organic EL display device 601 shown in FIG. 16. As shown in FIG. 17, the organic EL display device 601 includes a power supply 610, a controller 620, a drive circuit part 622, a pixel circuit 630, and an organic EL element 640. The drive circuit part 622 shown in FIGS. 16 and 17 includes a selection signal generation circuit 624, a data signal generation circuit 626, and a DAC 628 (Digital to Analog Converter). The pixel circuit 630 includes a selection line 631, a data line 632, a power line 633, a switching transistor 634, a drive transistor 635, and a retention capacitor 636. The switching transistor 634 and the drive transistor 635 are, for example, thin film transistor elements.

The power supply 610 is connected to the organic EL element 640 via the power line 633, and supplies drive power to the organic EL element 640. Specifically, the power supply 610 outputs the same power supply voltage VDD to the power line 633 in the aging mode of aging the organic EL element 640, and in the image display mode of displaying an image using the organic EL element 640.

The controller 620 selectively operates either in the aging mode or in the image display mode. Specifically, the controller 620 makes a judgment about whether to operate in the aging mode or in the image display mode in response to an operation signal that is input based on an operator's operation. Based on a result of the judgment of the respective modes, the controller 620 outputs a selection signal according to the respective modes to the selection signal generation circuit 624, outputs a digital brightness signal according to the respective modes to the data signal generation circuit 626, and outputs a switching signal according to the respective modes to the DAC 628.

More specifically, the selection signal generation circuit 624 is a shift register. The controller 620 outputs a start pulse to the selection signal generation circuit 624, once for each frame. Consequently, the start pulse sequentially shifts in the shift register, and a line in which the organic EL element 640 is to emit light is selected.

In relation to the digital brightness signal output to the data signal generation circuit 626, the controller 620 outputs the digital brightness signal for controlling the emission gradation of the organic EL element 640 to the data signal generation circuit 626. The controller 620 expresses a level of the brightness signal as a bit value of a digital signal. As the digital brightness signal, the controller 620 may use, for example, a component signal represented by brightness Y and color differences Cb and Cr. The bit number of the digital component signal output from the controller 620 is 10 bits in the aging mode, and 8 bits in the image display mode. Moreover, the controller 620 outputs the switching signal showing whether to handle (use) the digital component signal of either 10 bits or 8 bits to the DAC 628. In other words, the controller 620 uses a bit number in the aging mode that is greater than a bit number in the image display mode.

The selection signal generation circuit 624 applies a voltage for turning on the switching transistor 634 to a gate electrode of the switching transistor 634 of the line of the organic EL element 640 to emit light via the selection line 631, based on the selection signal output by the controller 620. Meanwhile, the selection signal generation circuit 624 applies a voltage for turning off the switching transistor 634 to the gate electrode of the switching transistor 634 of the line of the organic EL element 640 not to emit light via the selection line 631, based on the selection signal output by the controller 620.

The data signal generation circuit 626 converts the digital brightness signal represented by the brightness Y and color differences Cb and Cr into a digital brightness signal represented by red (R), green (G), and blue (B). In addition, the data signal generation circuit 626 uses an exchange map of the R, G, B digital brightness signals and the digital voltage signal to convert the R, G, B digital brightness signals into R, G, B digital voltage signals. The data signal generation circuit 626 outputs the converted R, G, B digital voltage signals to the DAC 628.

The DAC 628 is provided corresponding to the number of pixel columns provided in the organic EL display device 601. Moreover, the DAC 628 is provided on a signal transmission path for transmitting the digital brightness signal from the controller 620 toward the pixel circuit 630. Moreover, the DAC 628 converts the digital voltage signal output from the data signal generation circuit 626 into an analog data voltage. The DAC 628 applies the analog data voltage to the source electrode of the switching transistor 634 via the data line 632.

In addition, in the DAC 628, the bit number of the digital voltage signal used in the respective modes is switched so that the bit number of the digital voltage signal used in the aging mode becomes greater than the bit number of the digital voltage signal used in the image display mode based on the switching signal from the controller 620. This switching of the bit number is realized by masking high-order bits, in the image display mode, for a difference between the bit number of the available digital voltage signal set in the DAC 628 and the bit number required for the image display mode, and not masking such high-order bits in the aging mode.

For example, the DAC 628 is designed so that the bit number of the available digital voltage signal is 10 bits. Here, the DAC 628 sets the bit number of the digital voltage signal to be used in the aging mode to 10 bits. Moreover, the DAC 628 masks the high-order 2 bits in the image display mode to set the bit number of the digital signal to be used to 8 bits.

Specifically, the DAC 628 includes a register portion connected to the data signal generation circuit 626, a converter that receives parallel inputs from the respective registers of the register portion and converts a digital voltage signal into an analog voltage signal, and a masking portion that masks the high-order 2 bits of the digital voltage signal. As the converter, a ladder resistor-type DAC, a resistance string-type DAC, a pulse modulation-type DAC, a delta sigma-type DAC or the like, for example, may be used.

Hereinafter, as an example of the DAC 628, a case where the register portion is a shift register, and a digital voltage signal is input in serial to the register portion is described. A 2-input/1-output AND circuit may be provided between the high-order 2 bits of the register portion and the converter corresponding to the respective bits, as the masking portion. In this case, the digital voltage signal stored in the register portion is input to one input terminal of the respective AND circuits, and the switching signal output from the controller 620 is input to the other input terminal. Here, the bit number of the switching signal output from the controller 620 is 1 bit, and the bit number is set to 1 in the aging mode and set to 0 in the image display mode.

In the aging mode, the 10-bit digital voltage signal output from the data signal generation circuit 626 is stored in the register portion. Subsequently, the 10-bit digital voltage signal is output from the register portion to the converter. The bit value that is output from the high-order 2 bits of the register portion and passes through the AND circuit is equal to the bit value before being output from the high-order 2 bits of the register portion and passing through the AND circuit. This is because, since the bit value of the switching signal that is input to the AND circuit from the controller 620 is 1, regardless of whether the bit value that is input to the AND circuit from the high-order 2 bits of the register portion is 0 or 1, the bit values do not change before passing through the AND circuit and after passing through the AND circuit. Accordingly, the 10 bits of the register portion are directly output to the converter. Subsequently, the 10-bit digital voltage signal is converted into an analog data voltage by the converter, and the obtained analog data voltage is output to the data line 632.

In the image display mode, the 8-bit digital voltage signal output from the data signal generation circuit 626 is stored in the register portion. Subsequently, the 10-bit digital voltage, in which the high-order 2 bits are 0, is output from the register portion to the converter. This is because, since the bit value of the switching signal that is input to the AND circuit from the controller 620 is 0, regardless of whether the bit value that is input to the AND circuit from the high-order 2 bits of the register portion is 0 or 1, the bit values are 0 after passing through the AND circuit. Accordingly, in the image display mode, the high-order 2 bits of the 10-bit digital voltage signal input to the converter are always 0. Subsequently, the digital voltage signal is converted into an analog data voltage by the converter, and the obtained analog data voltage is output to the data line 632.

On the other hand, when the selection signal generation circuit 624 applies a voltage for turning on the switching transistor 634 to the gate electrode of the switching transistor 634, the analog data voltage is applied to the gate electrode of the drive transistor 635. Based on the voltage application, a drain current of a value according to the analog data voltage flows to the drive transistor 635, and this drain current flows into the organic EL element 640 to cause the organic EL element 640 to emit light.

(Operation of Organic EL Display Device)

Figure 18:
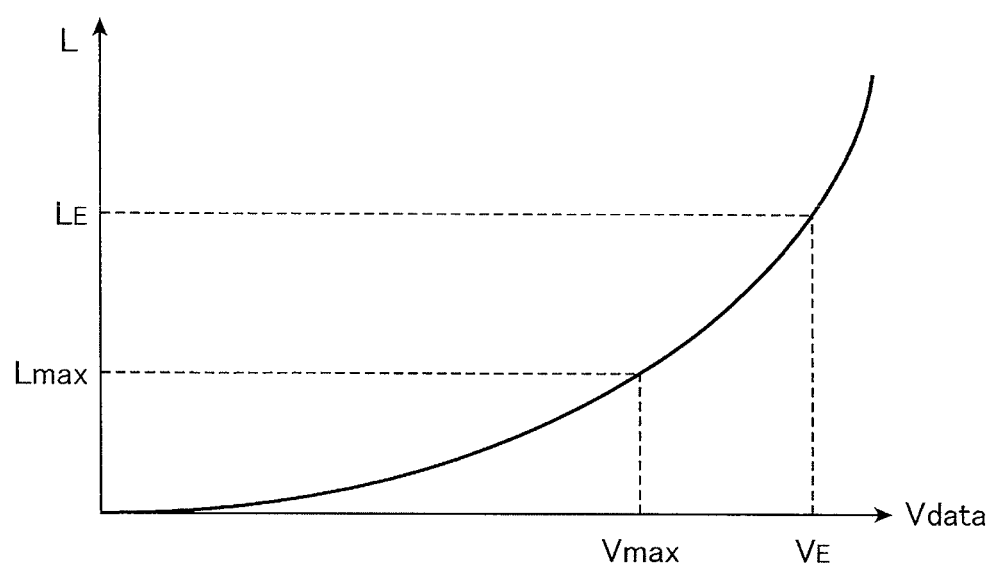
FIG. 18 is a diagram describing an operation of the organic EL display device shown in FIG. 16.

FIG. 18 is a diagram describing an operation of the organic EL display device 601 shown in FIG. 16. The horizontal axis in FIG. 18 shows a value of the analog data voltage Vdata applied to the gate electrode of the drive transistor 635. The vertical axis in FIG. 18 shows brightness L of the organic EL element 640 when the analog data voltage Vdata is applied thereto. A voltage Vmax is a voltage that is required for causing the organic EL element 640 to emit light at a maximum brightness Lmax in the image display mode. A voltage VE is a voltage that is required for performing aging.

As shown in FIG. 18, the brightness L of the organic EL element 640 tends to increase as the analog data voltage Vdata applied to the organic EL element 640 is greater. With the organic EL display device 601 of this embodiment, the voltage VE required for performing aging is applied from the controller 620 as with the voltage required for displaying an image. By setting the voltage VE to be greater than the voltage Vmax, brightness LE of the organic EL element 640 during aging becomes greater than the maximum brightness Lmax in the image display mode, and the aging time may thereby be shortened.

Accordingly, in the aging mode, the high voltage VE for aging is applied to the organic EL element 640. Consequently, in the aging mode, the organic EL element 640 is caused to emit light at the brightness LE that is higher than the maximum brightness Lmax in the image display mode. As a result, the aging time is shortened in this embodiment.

Hence, with the organic EL display device 601, the circuit design of the power supply 610 and the pixel circuit 630 is given flexibility in comparison to the case of driving the organic EL display device 601 in the image display mode. For example, the power supply 610 is designed to withstand a power supply voltage that is greater than the maximum power supply voltage required for displaying an image. Moreover, the switching transistor 634 and the drive transistor 635 need to be designed based on withstand voltage characteristics against the high voltage VE for aging. Note that, for example, the voltage VE is 1.5 times to 2 times the voltage Vmax, the brightness LE in the aging mode is 2 times to 3 times the maximum brightness Lmax in the image display mode, and the aging time is two hours to three hours.

Figure 19:
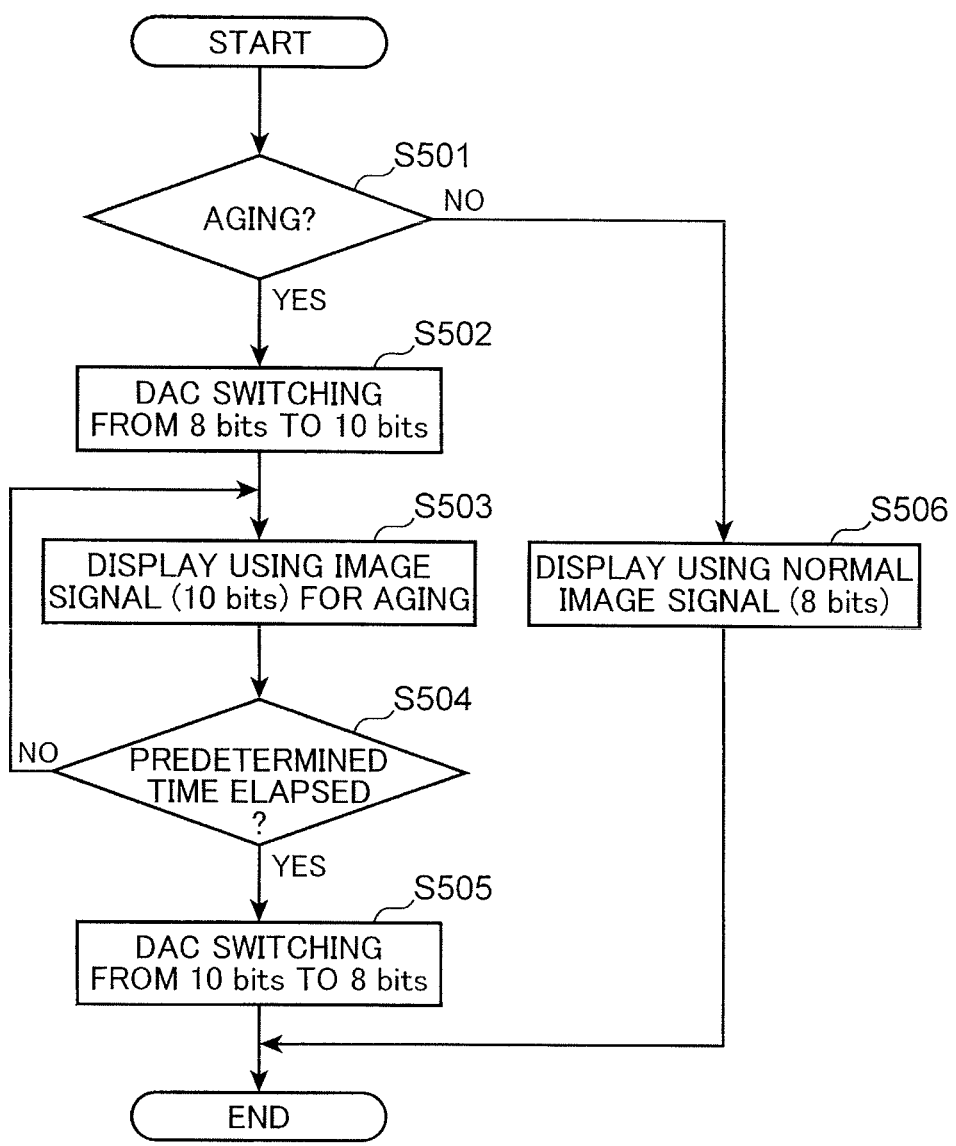
FIG. 19 is a flowchart of an operation under an aging mode and an image display mode in the organic EL display device shown in FIG. 16.

FIG. 19 is a flowchart of an operation under an aging mode and an image display mode in the organic EL display device 601 shown in FIG. 16.

Foremost, the controller 620 judges whether to perform aging (step S501). Specifically, when an operator judges that aging should be performed, an operation signal is input by the operator from the outside of the organic EL display device 601 into the controller 620. Accordingly, the controller 620 performs aging when an operation signal for performing aging is input, and does not perform aging when an operation signal for performing aging is not input.

When aging is to be performed (step S501: YES), the controller 620 switches the bit number of the digital signal used in the DAC 628 from 8 bits to 10 bits (step S502). Specifically, the controller 620 outputs a switching signal 1 to the AND circuit equipped in the DAC 628.

Subsequently, a display is performed using a 10-bit image signal of the aging mode (step S503). Specifically, the controller 620 outputs a selection voltage to the selection line 631 corresponding to a first line via the selection signal generation circuit 624. Moreover, the controller 620 outputs a 10-bit digital component signal that causes an analog data voltage VE in aging to be output from the DAC 628, to the data signal generation circuit 626.

Subsequently, the data signal generation circuit 626 converts the 10-bit digital component signal into 10-bit R, G, B digital brightness signals, and further converts these into 10-bit digital voltage signal. The DAC 628 acquires the 10-bit digital voltage signal, and converts this into an analog data voltage VE. The analog data voltage VE is applied to the gate electrode of the drive transistor 635 via the data line 632 and the switching transistor 634. Consequently, a current according to the analog data voltage VE flows from the drive transistor 635 to the organic EL element 640, and the organic EL element 640 emits light. This emission operation for each line is repeated from the second line to the last line of the organic EL display panel 605. As a result, the display of one frame is completed.

When the display of one frame is completed, the controller 620 judges whether a predetermined time has elapsed (step S504). When it is judged that the predetermined time has not elapsed (step S504: NO), the process returns to the processing of step S503. When it is judged that the predetermined time has elapsed (step S504: YES), the process proceeds to processing of step S505. It is thereby possible to cause the organic EL element 640 to emit light at high brightness for the predetermined time to perform aging. Note that, the predetermined time, which is the reference for judging the completion of aging, is set in advance from the relation of a cumulative emission time of the brightness and the maximum brightness, using the target maximum brightness of the emission elements immediately after the aging process.

When aging is completed, the controller 620 switches the bit number of the digital signal used in the DAC 628 from 10 bits to 8 bits (step S505). Specifically, the controller 620 outputs a switching signal 0 to the AND circuit equipped in the DAC 628.

When aging is not performed (step S501: NO), an image is displayed using normal image signals (step S506). Specifically, the controller 620 outputs an 8-bit digital component signal, which causes the analog data voltage Vdata in the image display mode to be output from the DAC 628, to the data signal generation circuit 626.

The data signal generation circuit 626 converts the 8-bit digital component signal into 8-bit R, G, B digital brightness signals, respectively, and additionally converts these into an 8-bit digital voltage signal. The DAC 628 acquires the 8-bit digital voltage signal, and converts this into an analog data voltage Vdata.

Subsequently, when the DAC 628 outputs the analog data voltage Vdata to the switching transistor 634 through the data line 632, the analog data voltage Vdata is applied to the gate electrode of the drive transistor 635, via the data line 632 and the switching transistor 634. Consequently, a current according to the analog data voltage Vdata flows into the organic EL element 640, and the organic EL element 640 thereby emits light. By repeating this process from the second line to the last line, the display of one frame is completed.

(Effect of Fourth Embodiment)

With the configuration of the fourth embodiment, in the aging mode, the organic EL element 640 emits light at brightness LE higher than the maximum brightness Lmax in the normal image display mode. Accordingly, the aging time may be shortened in comparison to the case of emitting light at the brightness in the normal image display mode. Moreover, since aging may be performed without having to use an external aging device even in the aging mode, deterioration in the throughput may be inhibited. Accordingly, with the configuration of the fourth embodiment, it is possible to inhibit the deterioration in the manufacturing efficiency while shortening the aging time.

In order to use external aging devices and simultaneously perform aging to organic EL display devices before shipment, aging devices corresponding to the number of organic EL display devices need to be operated. Nevertheless, when aging devices are operated in a plant, the plant equipment becomes complex. Moreover, when external aging devices are used, static electricity may enter via the connection terminal for applying a voltage from the outside to the emission elements to damage the circuit. With the configuration of the fourth embodiment, aging may be performed without having to use an external aging device. Accordingly, it is also possible to inhibit the plant equipment from becoming complex and the circuit from becoming damaged due to static electricity.

In addition, with the configuration of the fourth embodiment, the controller 620 switches the bit number of the digital voltage signal used in the DAC 628 corresponding to the aging mode or the image display mode after judging whether aging is to be performed. Hence, even when noise data from other household appliances such as a refrigerator is stored in the high-order 2 bits in the image display mode, the high-order 2 bits are masked and the bit value becomes 0. It is thereby possible to inhibit the organic EL element 640 from emitting light, in the image display mode, at high brightness equivalent to the brightness in the aging mode.

(Modified Example of Fourth Embodiment)

The fourth embodiment is described above, but the fourth embodiment is not limited to the foregoing configuration and operation. A modified example of the foregoing fourth embodiment is now described.

(Aging after Shipment)

The foregoing fourth embodiment has described a case of performing aging before the shipment of the organic EL display device. Nevertheless, without limitation thereto, the foregoing configuration and operation may also be adopted in aging that is performed after the shipment. In the post-shipment aging also, the aging time may be reduced based on the selective operation either in the aging mode or in the image display mode. Specifically, even when a trouble occurs in the organic EL display device after shipment, since an external aging device is not used in the aging process, aging may be performed on-site without having to return the organic EL display device to the plant. Note that, a case of performing post-shipment aging would be, for example, a case where there is variation in the maximum brightness of the respective emission elements in the organic EL display device.

(Determination of Completion of Aging)

In the foregoing fourth embodiment, as shown in step S504 of FIG. 19, a completion of aging is judged based on whether the predetermined time has elapsed from the start of aging. Nevertheless, without limitation thereto, the completion of aging may also be judged by directly detecting the brightness of the emission elements with a sensor, and by judging whether the brightness detection value exceeds a predetermined brightness. Specifically, the controller 620 may judge that the aging is completed when, for example, the brightness detection value falls below a predetermined brightness.

(Switching of DAC)

In the foregoing fourth embodiment, the switching of the bit number of the digital signal used in the DAC 628 is controlled by the controller 620 sending a switching signal to the DAC 628. Nevertheless, without limitation thereto, the switching signal of the bit number may be added to the data that is output from the data signal generation circuit 626. According to this modified example, the switching of the bit number in the DAC 628 may be controlled without the controller 620 having to send a switching signal to the DAC 628.

In the foregoing fourth embodiment, the bit number of the digital signal used in the DAC 628 is switched between 8 bits and 10 bits, but the configuration is not limited thereto. The bit number of the digital signal may be set according to the value of the analog data voltage VE in the aging mode to be set relative to the voltage Vmax corresponding to the maximum brightness in the image display mode.

For example, when the voltage VE is not greater than 2 times the voltage Vmax, the bit number of the digital signal used in the DAC 628 may be switched between 8 bits (image display mode) and 9 bits (aging mode). For example, when the voltage VE is greater than 2 times but not greater than 4 times the voltage Vmax, the bit number of the digital signal used in the DAC 628 may be switched between 8 bits (image display mode) and 10 bits (aging mode).

(Operation of Aging Mode)

In substitute for the operation of the aging mode in the foregoing fourth embodiment, the operation of the aging processing described in the foregoing first to third embodiments may be executed. Moreover, an operation that additionally gives consideration to the aging processing described in the foregoing first to third embodiments may be executed in the operation of the aging mode in the foregoing fourth embodiment. It is thereby possible to obtain an organic EL display panel 605 in which the positional variation in the aging level is moderated.

<Fifth Embodiment>

A fifth embodiment is now described. The fifth embodiment relates to a method for aging a display panel that uses emission elements such as organic EL elements. Foremost, problems encountered in an aging method are described, and a configuration and the like of the fifth embodiment are described thereafter.

(Problems Encountered in Aging Method)

In recent years, display panels using emission elements that emit light under voltage application have been developed. In addition, organic EL display panels that use organic EL elements as the emission elements are widely utilized. Maximum brightness of the emission elements decreases pursuant to an increase in a cumulative emission time immediately after a start of emission. In addition, the maximum brightness has brightness deterioration characteristics of tending to decrease steeply in an initial deterioration period, which is an initial cumulative emission period, immediately after the start of emission of the emission elements, and decrease gradually in a subsequent normal deterioration period. A life of the emission elements may be set forth as a time that the maximum brightness thereof diminishes by a certain ratio from the maximum brightness immediately after shipment of the display panel. In this case, if no measures are taken, the maximum brightness of the emission elements may diminish by the certain ratio in a short period after shipment of the display panel, and thereby may cause the emission elements to reach an end of their life.

With a standard display panel, aging is performed prior to a shipment thereof. Aging is processing of causing the emission elements to emit light for a given period of time to intentionally reduce the maximum brightness thereof, and thereby stabilize a brightness variation. Specifically, the aging of a display panel is performed by causing the emission elements of all luminescent colors to simultaneously start emitting light, and simultaneously stopping the emission after a lapse of a predetermined time. When aging is performed to the display panel before shipment, the period in which the maximum brightness of the emission elements decreases steeply is ended at a time of shipment. Accordingly, the maximum brightness of the emission elements gradually decreases during an entire period after shipment. As a result of performing aging as described above, it is thereby possible to inhibit the maximum brightness of the emission elements from diminishing by the certain ratio in a short period after shipment of the display panel.

In addition to the problem of moderating the positional variation in the aging level described in the first to third embodiments described above, there is a problem in that an amount of decrease in the maximum brightness in a cumulative emission period differs for each luminescent color since the emission elements have different brightness deterioration characteristics for each luminescent color. Hence, when aging of simultaneously starting the emission of the emission elements of all luminescent colors and simultaneously stopping the emission after the lapse of a predetermined time, the aging of the emission elements may become excessive or insufficient for each luminescent color, and the life of the emission elements may differ for each luminescent color.

Japanese Patent Application Publication No. 2003-323979 discloses techniques for adjusting a length of an aging period (hereinafter referred to as the "aging time") for each luminescent color of red (R), green (G), and blue (B) according to the brightness deterioration characteristics of the emission elements. The disclosed techniques are as follows. When aging is performed, foremost, the aging of an R emission element is started and the aging is ended after a lapse of a given period of time. Subsequently, the aging of a G emission element is started and the aging is ended after a lapse of a given period of time. And finally, the aging of a B emission element is started and the aging is ended after a lapse of a given period of time. In other words, aging is performed sequentially for each luminescent color according to the techniques described in the foregoing Publication.

With the aging method of the foregoing conventional display panel, since aging is performed by giving consideration to the brightness deterioration characteristics, it is possible to inhibit the aging of the emission elements from becoming excessive or insufficient for each luminescent color, and from causing the life of the emission elements to differ for each luminescent color. Nevertheless, since aging is performed sequentially for each luminescent color, a time obtained by adding the aging time of the respective luminescent colors is required for performing the aging of all emission elements. Hence, there is a problem in that the aging time becomes long. When the aging time becomes long, the manufacturing efficiency of the display panel decreases.

Thus, the fifth embodiment provides an aging method of a display panel capable of shortening the aging time while performing aging in which the brightness deterioration characteristics that differ for each luminescent color is taken into consideration.

(Overall Configuration of Organic EL Display Panel)

A configuration of an organic EL display panel aging system that uses organic EL elements as emission elements according to the fifth embodiment is now described with reference to FIGS. 21 and 22.

Figure 21:
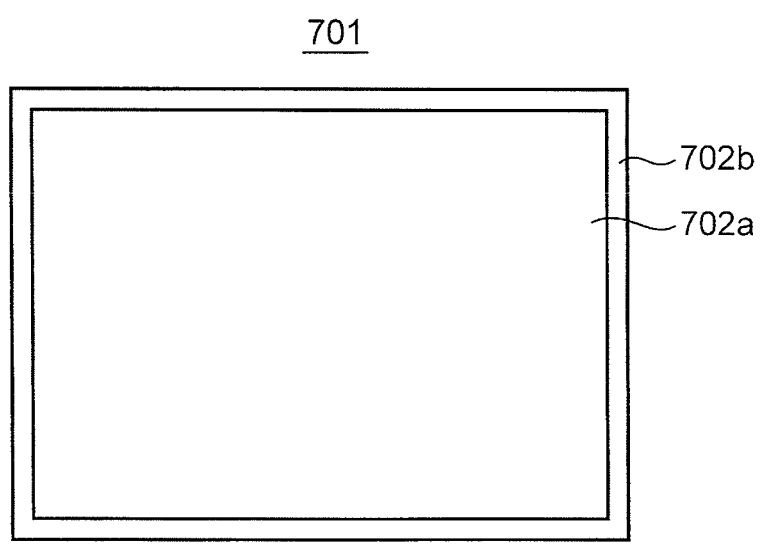
FIG. 21 is a schematic diagram of an organic EL display panel.

FIG. 21 is a schematic diagram of an organic EL display panel 701. FIG. 22 is a circuit diagram of one pixel of the organic EL display panel 701 and a block diagram of the aging system that is connected to the organic EL display panel 701.

As shown in FIG. 21, the organic EL display panel 701 is of a rectangular shape in a plan view. The organic EL display panel 701 includes a pixel region 702a having pixels, and a peripheral part 702b encompassing the pixel region 702a. Moreover, the organic EL display panel 701 is a panel that utilizes an electroluminescence phenomenon of an organic material. In the organic EL display panel 701, the pixels are arranged, for example, in a matrix. The image display of one pixel is performed based on the emission of different luminescent colors, for example, three sub-pixels of R, G, B.

The emission element is an organic EL element, and is configured by the following materials being laminated in order; namely, a substrate made of glass or the like, an anode electrode made of metal such as Al, a hole injection layer, a hole transport layer, an emission layer including an organic material, an electron transport layer, an electron injection layer, a cathode electrode made of a transparent material such as ITO (Indium Tin Oxide), and a sealing material. The difference in the luminescent colors (R, G, B) of the emission element is due to the difference in the materials of the emission layer.

Figure 22:
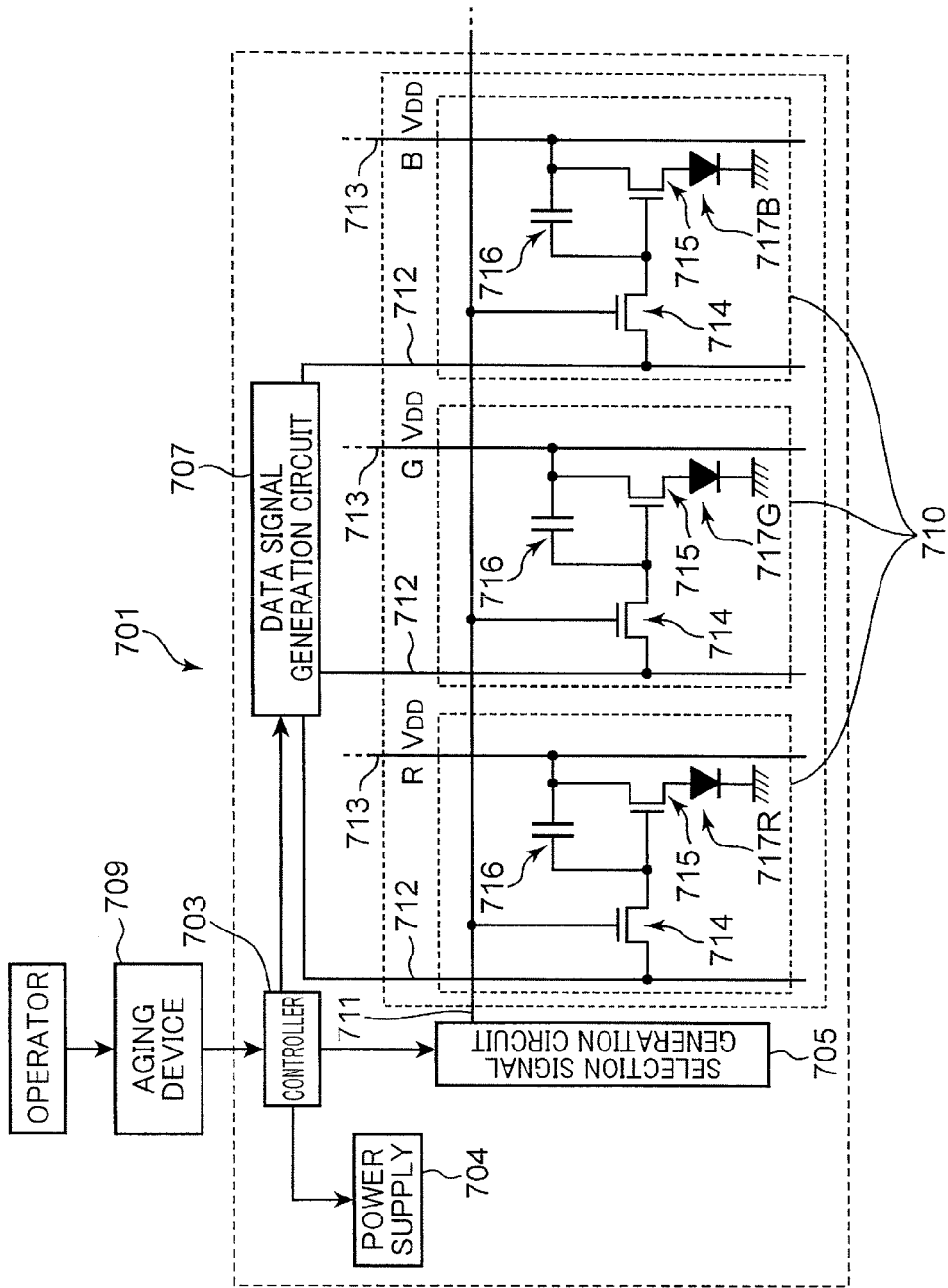
FIG. 22 is a circuit diagram of one pixel of the organic EL display panel and a block diagram of an aging system that is connected to the organic EL display panel.

As shown in FIG. 22, the organic EL display panel 701 includes a controller 703, a power supply 704, a selection signal generation circuit 705, and a data signal generation circuit 707 in addition to sub-pixels 710. The controller 703 is connected to an aging device 709 when aging is performed. The R sub-pixel 710 includes a selection line 711, a data line 712, a power line 713, a switching transistor 714, a drive transistor 715, a retention capacitor 716, and an emission element 717R.

The configuration of the G, B sub-pixels 710 is the same as the R sub-pixel 710 other than the point of respectively including emission elements 717G, 717B in substitute for the emission element 717R. In the ensuing description, when there is no particular need for differentiation, the emission elements 717R, 717G, 717B are collectively referred to as the "emission element 717". The switching transistor 714 and the drive transistor 715 are, for example, thin film transistor elements.

A drive of the organic EL display panel 701 is the same in both aging and image display. Foremost, the controller 703 controls the power supply 704 so as to apply a power supply voltage to the power line 713. Moreover, the controller 703 outputs a selection signal to the selection signal generation circuit 705, and outputs a digital brightness signal to the data signal generation circuit 707.

More specifically, the selection signal generation circuit 705 is a shift register, and the controller 703 outputs a start pulse to the selection signal generation circuit 705, once for each frame. Consequently, the start pulse sequentially shifts in the shift register, and the line in which the emission element 717 is to emit light is selected.

In relation to the digital brightness signal output to the data signal generation circuit 707, the controller 703 outputs the digital brightness signal for controlling the emission gradation of the emission element 717 to the data signal generation circuit 707. The controller 703 may use, for example, a component signal represented by brightness Y and color differences Cb and Cr.

The selection signal generation circuit 705 applies a voltage for turning on the switching transistor 714, based on the selection signal output by the controller 703, to a gate electrode of the switching transistor 714 of the line of the emission element 717 to emit light, via the selection line 711. On the other hand, the selection signal generation circuit 705 applies a voltage for turning off the switching transistor 714 based on the selection signal output by the controller 703, to the gate electrode of the switching transistor 714 of the line of the o emission element 717 not to emit light, via the selection line 711.

The data signal generation circuit 707 converts the digital brightness signal represented by brightness Y and color differences Cb and Cr into a digital brightness signal represented by R, G, B. In addition, the data signal generation circuit 707 uses an exchange map of the R, G, B digital brightness signals and the digital voltage signal to convert the R, G, B digital brightness signals into R, G, B digital voltage signals. The data signal generation circuit 707 additionally converts the R, G, B digital voltage signals into analog voltage signals, and outputs the analog voltage signals to the data line 712.

Accordingly, when the switching transistor 714 is turned on, an analog voltage is applied to the gate electrode of the drive transistor 715. Consequently, a drain current of a value according to the analog voltage flows to the drive transistor 715. This drain current flows into the emission element 717 to cause the emission element 717 to emit light.

When aging is performed, foremost, an operator inputs an aging time of the emission element 717 for each R, G, B into the aging device 709. Subsequently, when the aging time is input from the aging device 709 into the controller 703, the controller 703 controls the power supply 704 so as to output a power supply voltage that is higher than the case of displaying an image. Moreover, the controller 703 outputs signals as the digital brightness signals output to the data signal generation circuit 707 so that the R, G, B digital brightness signals become a maximum gradation.

(Aging Operation)

Figure 23:
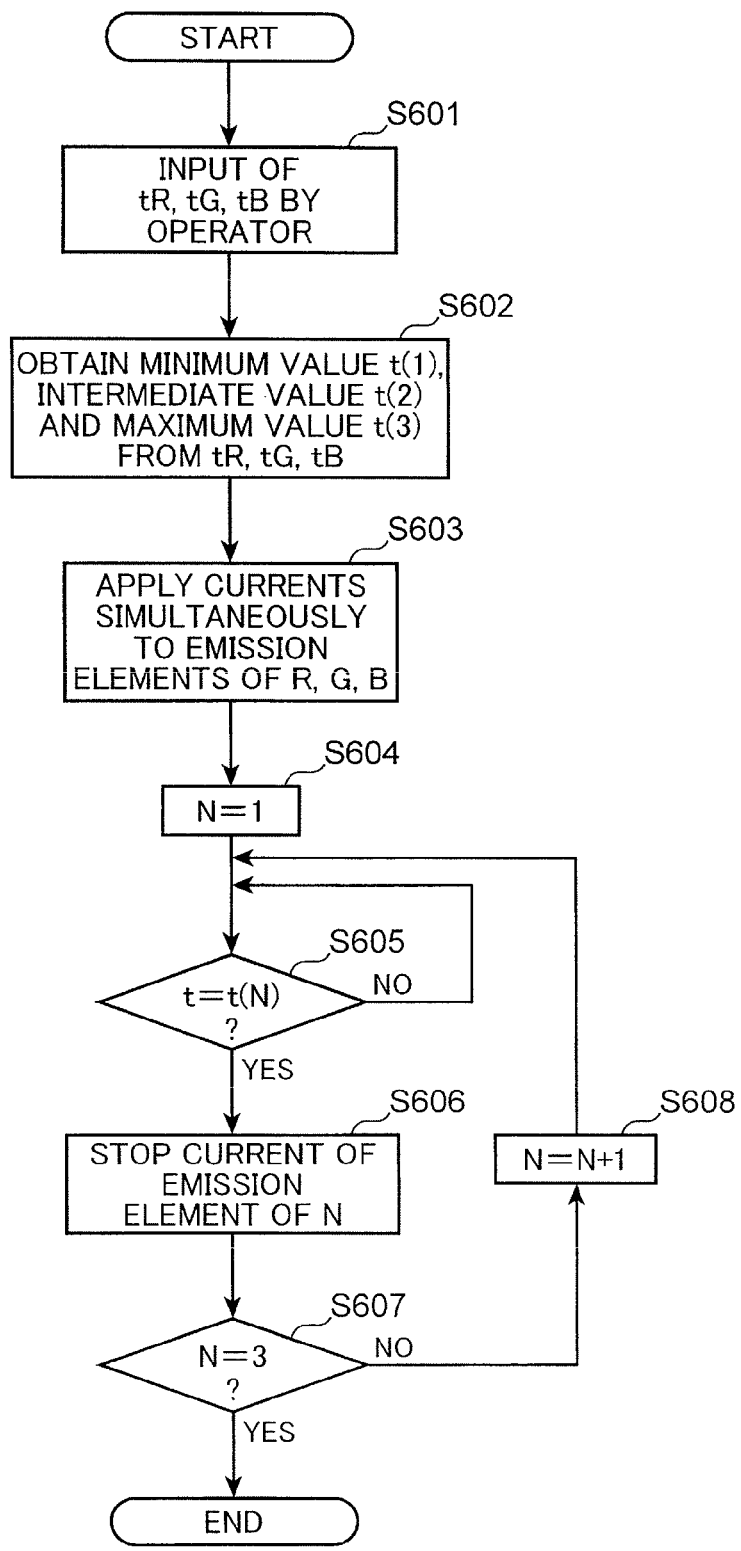
FIG. 23 is a flowchart upon execution of aging of the organic EL display panel shown in FIG. 21, 22.

FIG. 23 is a flowchart upon execution of aging of the organic EL display panel 701 shown in FIGS. 21, 22.

Foremost, aging time tR, tG, tB is input by an operator (step S601). Specifically, the operator inputs the aging time of the emission elements for each luminescent color R, G, B calculated in advance in the aging device 709. The aging time tR, tG, tB for each luminescent color is determined according to the brightness deterioration characteristics of the respective emission elements 717R, 717G, 717B. In this embodiment, each aging time tR, tG, tB is different.

The aging device 709 obtains a minimum value t(1), an intermediate value t(2), and a maximum value t(3) among the aging time tR, tG, tB input by the operator (step S602). Specifically, in a case where the aging device 709 includes a CPU and a register, the CPU may arrange the aging time tR, tG, tB in ascending order, and store the aging time tR, tG, tB in the register t(N). The aging device 709 outputs the aging time tR, tG, tB and the minimum value t(1), the intermediate value t(2), and the maximum value t(3) to the controller 703.

Subsequently, currents are simultaneously supplied to the R, G, B emission elements 717 (step S603). Consequently, the R, G, B emission elements 717 simultaneously emit light, and the aging of the R, G, B emission elements 717 is simultaneously started. Specifically, the controller 703 controls the power supply 704, the selection signal generation circuit 705, and the data signal generation circuit 707. As a result, the power supply 704 outputs a power supply voltage that is higher than in the case of displaying an image, to the power line 713. The selection signal generation circuit 705 selects the line for causing the emission element 717 to emit light. The data signal generation circuit 707 outputs an analog voltage according to the R, G, B digital brightness signals of a maximum gradation, to the data line 712.

When the selection signal generation circuit 705 turns on the switching transistor 714, the analog voltage of the data line 712 is applied to the gate electrode of the drive transistor 715 via the switching transistor 714. A drain current corresponding to the analog voltage of the data line 712 flows into the emission element 717, and the R, G, B emission elements 717 emit light. In other words, the data signal generation circuit 707 outputs analog voltages to the data lines 712 of R, G, B so that the digital brightness signals become maximum gradation. As a result, the aging of the emission elements 717 of R, G, B is performed.

In addition, when the aging device 709 sets 1 to N (step S604), the aging device 709 waits for a predetermined time t(N) to elapse (step S605: NO). When the predetermined time t(N) elapses (step S605: YES), the current of the emission element 717 of the luminescent color corresponding to the predetermined time t(N) is stopped (step S606). Consequently, the aging of the emission element 717 of the luminescent color corresponding to the predetermined time t(N) is ended. Note that the supply of currents is continued to the emission elements 717 of the luminescent colors other than the luminescent color corresponding to the predetermined time t(N).

Specifically, the data signal generation circuit 707 outputs an analog voltage of 0 V to the data line 712 of the luminescent color corresponding to the predetermined time t(N). Accordingly, the current of the relevant emission element 717 is stopped. Meanwhile, the data signal generation circuit 707 outputs an analog voltage to the data lines 712 other than the luminescent color corresponding to the predetermined time t(N) so that the digital brightness signals become maximum gradation. Accordingly, the supply of current to the relevant emission element 717 is continued, and aging is also continued. The value of the currents in the emission elements 717 of the luminescent colors other than the luminescent color corresponding to the predetermined time t(N) does not change before and after the current of the relevant emission element 717 is stopped.

Subsequently, whether N=3 is judged (step S607). When it is not judged that N=3 (step S607: NO), 1 is added to N (step S608), and the routine returns to the processing of step S605. When it is judged that N=3 (step S607: YES), the aging processing of all R, G, B emission elements 717 is complete. Specifically, when tB<tG<tR, and the routine reaches step S607 when N=1, the aging of the B emission element 717B is ended. The value of the currents flowing through the G, R emission elements 717G, 717R does not change before and after the aging period of the B emission element 717B is ended.

Accordingly, the aging of all R, G, B emission elements 717 is simultaneously started, and aging is completed after the lapse of the input aging time tR, tG, tB.

(Calculation of Aging Time for Each Luminescent Color)

The method of determining the aging time tR, tG, tB input into the aging device 709 in step S601 of FIG. 23 is now described with reference to FIGS. 24A and 24B.

Figure 24A:
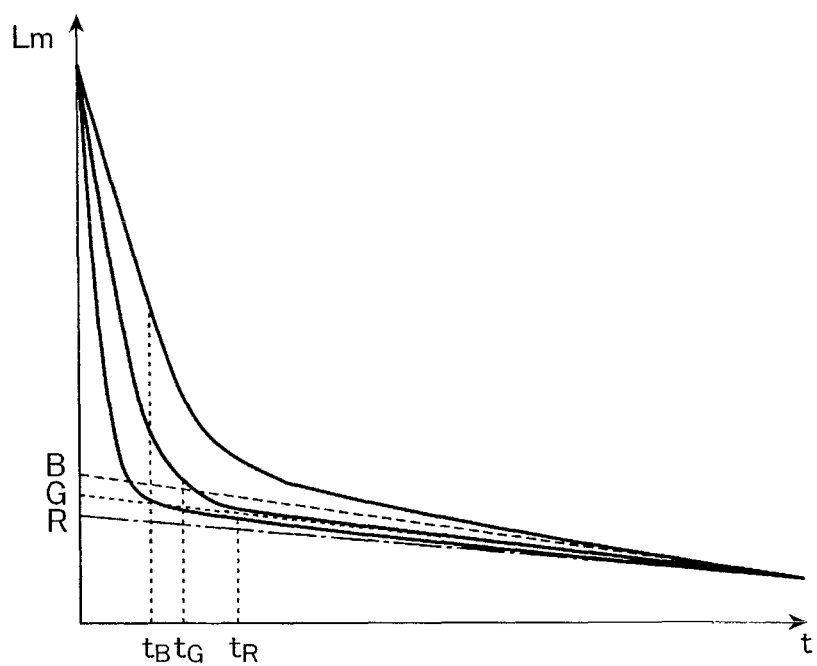
FIG. 24A is a diagram for determining an aging time according to the embodiment based on a relation of a cumulative emission time and maximum brightness of the organic EL display panel shown in FIGS. 21, 22.

FIG. 24A is a diagram for determining an aging time according to this embodiment based on a relation of a cumulative emission time and maximum brightness of the organic EL display panel shown in FIGS. 21 and 22. FIG. 24B is a diagram for determining an aging time based on a relation of a cumulative emission time and maximum brightness of the organic EL display panel in the technologies described in foregoing Japanese Patent Application Publication No. 2003-323979. An initial period from an emission starting point of the emission element 717 is an initial deterioration period, and the maximum brightness Lm decreases steeply. On the other hand, during a normal deterioration period after the initial deterioration period, the maximum brightness Lm decreases gradually.

In the fifth embodiment, in order to determine the aging time, foremost, as shown in FIG. 24A, a first-order approximation curve is drawn at a portion corresponding to a normal deterioration period after an initial deterioration for each luminescent color. As an inclination of this first-order approximation curve is greater, it could be said that a brightness decreasing rate of the emission element 717 in the normal deterioration period is greater. The aging time is shortened in order from the largest inclination of the first-order approximation curve corresponding to the brightness decreasing rate of the emission element 717 in the normal deterioration period. Here, the first-order approximation curve in the normal deterioration period may be drawn at a portion corresponding to an area between, for example, 50% to 40% from the maximum brightness in one luminescent color. As to the remaining luminescent colors, the first-order approximation curve may be drawn at the portion corresponding to the same t.

As described above, the aging time tR, tG, tB is adjusted to differ for each luminescent color according to the brightness deterioration characteristics of the emission element 717.

Figure 24B:
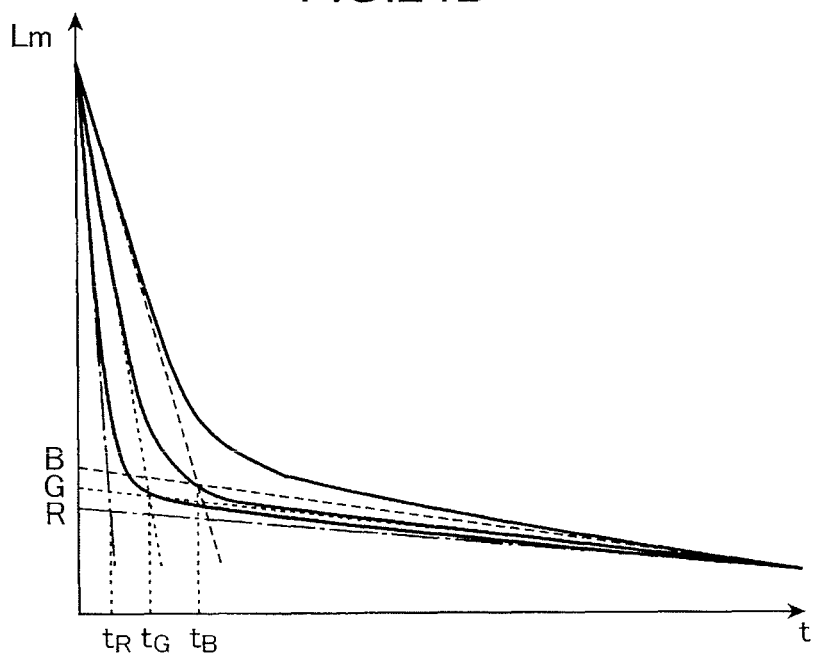
FIG. 24B is a diagram for determining an aging time according to the embodiment based on a relation of a cumulative emission time and maximum brightness of an organic EL display panel in the technologies described in Japanese Patent Application Publication No. 2003-323979.

With the technology described in Japanese Patent Application Publication No. 2003-323979, in order to determine the aging time, foremost, as shown in FIG. 24B, first-order approximation curves are drawn respectively in the initial deterioration period for each luminescent color and in the normal deterioration period after the initial deterioration. Then, the time corresponding to the intersection of these two first-order approximation curves is obtained. In addition, the obtained intersection is assumed to be the end point of the initial deterioration period for each luminescent color, and the end point of the initial deterioration period is set as the end point of aging. In this way, the end point of aging is set corresponding to the brightness decreasing rate of the initial deterioration period.

As possible causes of brightness deterioration of the emission element 717, there are deterioration in an interface in the emission element 717 and deterioration in a material itself of the emission element 717. The deterioration in the interface in the emission element 717 occurs during the initial deterioration period. The deterioration in the interface in the emission element 717 may include, for example, deterioration that occurs as a result of the organic material configuring the emission layer diffusing to the anode electrode made of metal, or deterioration that occurs as a result of the oxygen or water contained in the emission layer diffusing to the anode electrode made of metal. The foregoing diffusion ends during the initial state of emission of the emission element 717. Thus, it is considered that the deterioration in the interface in the emission element 717 occurs during the initial deterioration period.

On the other hand, the deterioration in the material itself of the emission element 717, the deterioration of the material configuring the emission layer of the emission element 717 for example, occurs throughout the cumulative emission period. The deterioration in the material itself of the emission element 717 may include, for example, deterioration due to decomposition of the organic material configuring the emission layer caused by applying current, or deterioration of the emission layer caused by ultraviolet rays generated by emitted light from the emission layer itself. Accordingly, deterioration in the material itself of the emission element 717 occurs even during the aging, that is, even during the initial deterioration period.

As shown in FIG. 24B, with the technology described in Japanese Patent Application Publication No. 2003-323979, the point corresponding to the intersection of two first-order approximation curves is set as the end point of aging in consideration of a difference in the brightness deterioration characteristics of each luminescent color during the initial deterioration period. Nevertheless, in a case where the foregoing intersection is used as the end point of aging, when the inclination of the first-order approximation curve of the portion corresponding to the normal deterioration period is large, deterioration in the material itself of the emission element progresses during aging. Consequently, the life of the emission element of a luminescent color having such large inclination may become shorter in comparison to the other emission elements.

In this case, in the organic EL display panel after aging, when the cumulative emission time increases and the deterioration of the emission element progresses, a degree of brightness deterioration of the emission elements for each luminescent color may become considerably different. For example, when emitting light using all pixels of R, G, B, if the degree of brightness deterioration is different, the white balance may be lost, and the image quality of the displayed image may deteriorate.

(Effect of Fifth Embodiment)

In this embodiment, currents are simultaneously supplied to the R, G, B emission elements 717R, 717G, 717B at a start of aging. Accordingly, a starting point of the aging period of each of the luminescent colors is the same. Hence, at least a part of the aging periods of all R, G, B overlap. Accordingly, the aging time may be shortened in comparison to the case of sequentially performing aging for each luminescent color.

In this embodiment, aging is performed in an aging time that gives consideration to the brightness deterioration characteristics for each luminescent color. Hence, it is possible to inhibit the aging of the emission element 717 from becoming excessive or insufficient for each luminescent color and from causing the life of the emission element 717 to differ for each luminescent color, which in turn causes image quality of displayed image to deteriorate.

(Modified Example of Fifth Embodiment)

The fifth embodiment is described above, but the fifth embodiment is not limited to the foregoing configuration and operation. A modified example of the foregoing fifth embodiment is now described.

(Number of Emission Elements to which Currents are to be Supplied Simultaneously with Start of Aging)

In the foregoing fifth embodiment, the starting point of the aging period of all luminescent colors is the same as a result of simultaneously supplying currents to the emission elements of three colors at the start of aging. Nevertheless, without limitation thereof, the starting point of the aging period of two colors is the same, when currents are simultaneously supplied to the emission elements of at least two colors. Consequently, the effect of shortening the aging time is yielded by simultaneously performing aging.

(Method of Overlapping Aging Period)

In the foregoing fifth embodiment, there is a period in which the aging periods of the three colors overlap. Nevertheless, without limitation thereto, the effect of shortening the aging time is yielded by starting, during the aging period of a certain luminescent color, at least one aging period of the other luminescent colors.

(Operation of Aging)

In the foregoing fifth embodiment, the aging device 709 obtains the minimum value, the intermediate value, and the maximum value from the aging time tR, tG, tB input by the operator into the aging device 709 at the start of aging. Nevertheless, without limitation thereof, the operator may input information showing the correspondence relation between the aging time tR, tG, tB and the minimum value, the intermediate value, the maximum value into the aging device 709, in addition to the aging time tR, tG, tB.

(Value of Currents to be Supplied to Emission Elements During Aging)

In the foregoing fifth embodiment, the aging periods of the G, R emission elements 717G, 717R still remain at the end of the aging period of the B emission element 717B. A value of the current flowing through the G, R emission elements 717G, 717R before and after the end of the aging period of the B emission element 717B does not change. Nevertheless, without limitation thereto, as the value of the current supplied to the G, R emission elements 717G, 717R, an arbitrary value may be selected, the arbitrary value being greater than a sum of the currents supplied to the G, R emission elements 717G, 717R before the end of the aging period of the B emission element 717B, and smaller than a sum of the currents flowing through the three emission elements 717 before the end of the aging period of the B emission element 717B. This operation is now described with reference to the drawings.

Figure 25:
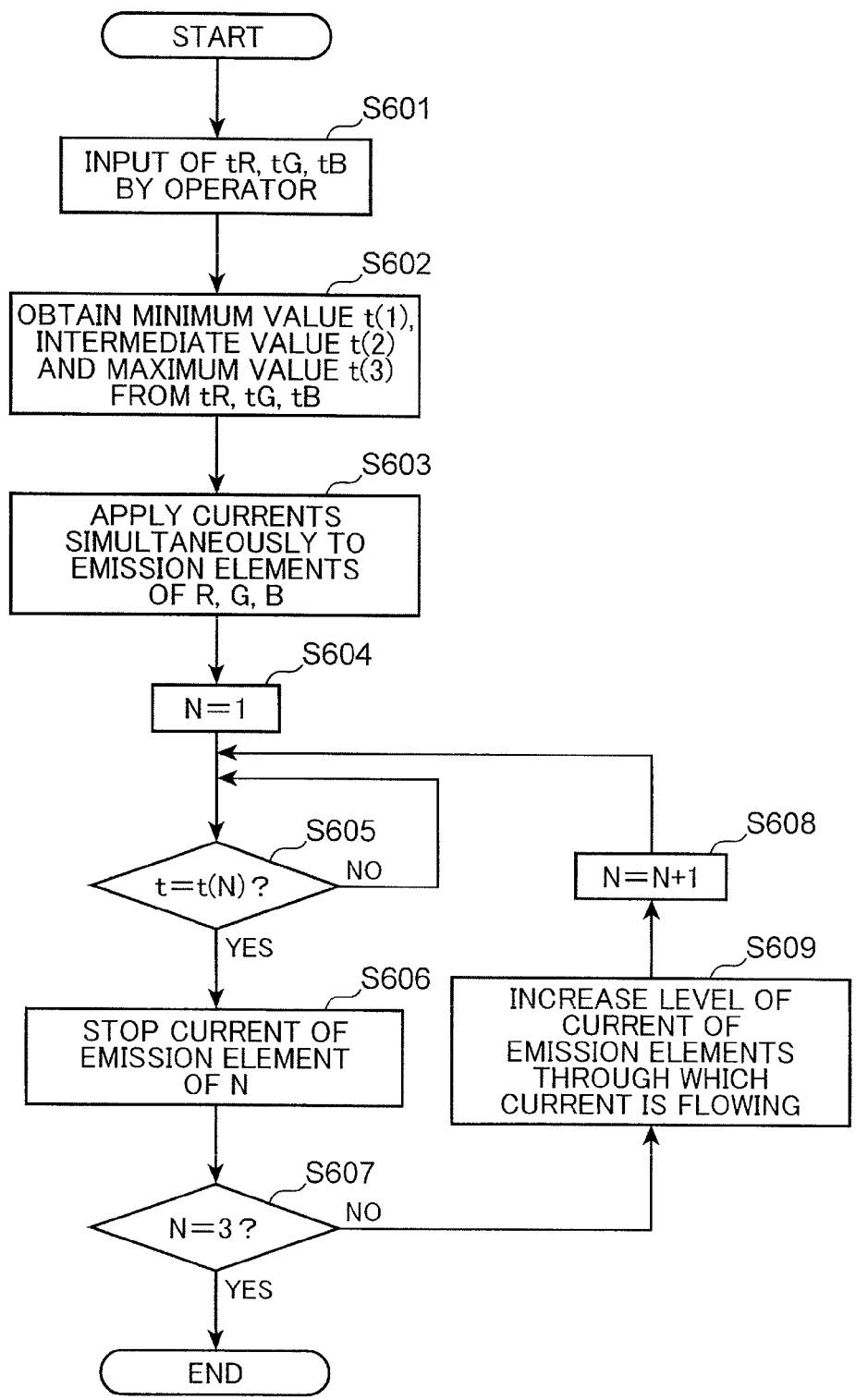
FIG. 25 is a flowchart upon execution of aging of an organic EL display panel according to a modified example of the fifth embodiment. . . .

FIG. 25 is a flowchart upon execution of aging of an organic EL display panel according to a modified example of the fifth embodiment. In FIG. 25, the same steps as those in the flowchart shown in FIG. 23 are given the same reference numeral as FIG. 23.

After currents are simultaneously supplied to the R, G, B emission elements (step S603), the current of the emission element of the luminescent color corresponding to the predetermined time t(N) is stopped (step S606). Accordingly, the aging of the emission element of the luminescent color corresponding to the predetermined time t(N) is ended. When it is judged that N=3 is not satisfied (step S607: NO), the value of the currents supplied to the emission elements other than the stopped emission element is increased (step S609). Then, the process proceeds to step S608. When the currents supplied to the G, R emission elements 717G, 717R are increased, the aging time may be shortened even when there is a limit in the value of the power supply voltage.

Note that the value of the currents supplied to the emission elements is determined by the gate voltage of the drive transistor 715. In order to change the gate voltage of the drive transistor 715, the voltage that is output by the data signal generation circuit 707 to the data line 712 may be changed.

Specifically, the data signal generation circuit 707 may retain an aging exchange map in addition to the normal display exchange map as the exchange map of the R, G, B digital brightness signals and the digital voltage signals. When the same digital brightness signal is input to the aging exchange map and the normal display exchange map, a digital voltage signal is output from the aging exchange map greater than that from the normal display exchange map. Hence, by using the aging exchange map, the digital brightness signal is exchanged to a greater digital voltage signal than in the case of using the normal display exchange map.

As a specific operation, for example, when the aging periods of the G, R emission elements 717G, 717R remain at the end of the aging period of the B emission element 717B, the controller 703 outputs a signal corresponding to the G, R digital brightness signals of a gradation greater than before stopping the current of the B emission element 717B to the data signal generation circuit 707. As a result, the data signal generation circuit 707 outputs an analog voltage higher than before stopping the current of the B emission element 717B to the G, R data lines 712. Consequently, when the aging periods of the G, R emission elements 717G, 717R remain at the end of the aging period of the B emission element 717B, the value of the currents flowing through the G, R emission elements 717G, 717R may be increased during a period from before to after the end of the aging period of the B emission element 717B.

(No Aging Device)

In the above fifth embodiment, aging is performed by supplying a voltage from the aging device 709 external of the organic EL display panel 701, but the configuration is not limited thereto, and aging may also be performed by supplying a voltage from a circuit within the organic EL display panel 701 as with a normal image display.

(Aging Operation)

In substitute for the operation of the aging mode in the foregoing fifth embodiment, the operation of the aging processing described in the foregoing first to third embodiments may be executed. Moreover, an operation that additionally gives consideration to the aging processing described in the foregoing first to third embodiments may be executed in the operation of the aging mode in the foregoing fifth embodiment. It is thereby possible to obtain an organic EL display panel 701 in which the positional variation in the aging level is moderated.

The method for manufacturing an emission panel according to the embodiments described above mainly includes the following configuration.

An emission panel manufactured in accordance with a manufacturing method according to one aspect of the embodiments described above has an emission portion including pixels, through which currents of mutually different values flow under a condition that voltages of mutually identical values are applied to the respective pixels. The manufacturing method includes: an acquisition step of acquiring correction coefficients for correcting the values of the voltages applied to the respective pixels to reduce differences among the values in current flowing through the respective pixels; and an aging step of executing aging processing on the pixels, the aging processing being executed by correcting the values of the voltages applied to the respective pixels using the correction coefficients and by applying the corrected voltages to the respective pixels.

According to the above configuration, in the acquisition step, correction coefficients for correcting the values of the voltages applied to the respective pixels to reduce differences among values in current flowing through the respective pixels are acquired. In the aging step, the values of the voltages applied to the respective pixels are corrected using the correction coefficients. Moreover, aging processing on the pixels is executed by applying the corrected voltages to the pixels. The voltages which are corrected using the correction coefficients are applied to the respective pixels. Thus, the differences among the values in current flowing through the respective pixels are reduced. Consequently, variation in the aging level between the respective pixels is moderated.

In the foregoing configuration, the manufacturing method may further comprise a calculation step before the acquisition step. The calculation step may include: a first step of applying a predetermined reference voltage to the respective pixels, and measuring characteristics representing the currents flowing through the respective pixels to obtain measurement values; and a second step of calculating the correction coefficients based on the measurement values and the reference voltage. The correction coefficients calculated in the second step may be acquired in the acquisition step.

According to the above configuration, the calculation step is executed before the acquisition step. In the first step of the calculation step, a predetermined reference voltage is applied to the respective pixels. Moreover, characteristics representing the currents flowing through the respective pixels are measured to obtain measurement values. In the second step of the calculation step, the correction coefficients are calculated based on the measurement values and the reference voltage. The correction coefficients calculated in the second stage are acquired in the acquisition step. In this way, the correction coefficients are calculated based on the measurement values of the characteristics representing the currents flowing through the respective pixels when the reference voltage is applied, and the reference voltage. Hence, it is possible to obtain correction coefficients which reduce the differences among the values in current flowing through the respective pixels.

In the foregoing configuration, the calculation step may further include a third step of storing the correction coefficients calculated in the second step as table data in which the pixels and the correction coefficients are associated with each other. The correction coefficients in the acquisition step may be acquired from the table data stored in the third step.

According to the above configuration, in the third step of the calculation step, the correction coefficients are stored as table data in which the pixels and the correction coefficients are associated with each other. The correction coefficients in the acquisition step are acquired from the table data stored in the third step. Thus, the correction coefficients are easily acquired simply by reading the table data without requiring any arithmetic operation.

In the foregoing configuration, the calculation step may further include a third step of calculating and storing a correction function representing the correction coefficients calculated in the second step with respect to positions of the respective pixels in the emission portion. The correction coefficients in the acquisition step may be calculated from the positions of the respective pixels in the emission portion and the correction function stored in the third step.

According to the above configuration, in the third step of the calculation step, a correction function representing the correction coefficients calculated in the second step with respect to positions of the respective pixels in the emission portion is calculated and stored. The correction coefficients in the acquisition step are calculated from the positions of the respective pixels in the emission portion and the correction function stored in the third step. The correction function is stored in this way. Thus, the correction coefficients are acquired without requiring a large capacity for storing data.

In the foregoing configuration, the values of currents flowing through the pixels may be respectively measured as the characteristics in the first step.

According to the above configuration, the values of currents flowing through the pixels may be respectively measured as the characteristics in the first step. Thus, the correction coefficients are suitably calculated based on the measurement values of the current values and the reference voltage in the second step.

In the foregoing configuration, brightness of the pixels may be respectively measured as the characteristics in the first step. The values of current flowing through the pixels may be obtained based on the measurement values and a relation between the brightness and the current value of the pixels, and the correction coefficients may be calculated based on the obtained values of current and the reference voltage, in the second step.

According to the above configuration, brightness of the pixels are respectively measured as the characteristics in the first step. The values of current flowing through the pixels are obtained based on the measurement values and a relation between the brightness and the current value of the pixels in the second step. Further, the correction coefficients are calculated based on the obtained values of current and the reference voltage. The brightness of the pixels may be measured in a short time in comparison to the case of measuring the currents flowing through the pixels. Thus, the correction coefficients are calculated in a short time.

In the foregoing configuration, the emission portion may include a first pixel and a second pixel as the pixels, the first pixel and the second pixel being disposed at mutually different positions. The first pixel may be connected to a circuit board via a first conducting wire, the circuit board applying voltages to the pixels. The second pixel may be connected to the circuit board via a second conducting wire shorter than the first conducting wire. The correction coefficients acquired in the acquisition step may be determined for the voltage applied to the first pixel to become higher than the voltage applied to the second pixel.

According to the above configuration, the emission portion includes a first pixel and a second pixel as the pixels, the first pixel and the second pixel being disposed at mutually different positions. The first pixel is connected to a circuit board via a first conducting wire, the circuit board applying voltages to the pixels. The second pixel is connected to the circuit board via a second conducting wire shorter than the first conducting wire. Thus, when voltages of an identical value are applied to the first pixel and the second pixel, the value of the current flowing through the first pixel becomes smaller in comparison to the value of the current flowing through the second pixel. The correction coefficients acquired in the acquisition step are determined for the voltage applied to the first pixel to become higher than the voltage applied to the second pixel. Accordingly, the difference between the value of the current flowing through the first pixel and the value of the current flowing through the second pixel is appropriately reduced.

In the foregoing configuration, each of the pixels may include an organic EL element. According to the above configuration, each of the pixels includes an organic EL element. Thus, an emission panel, in which the variation in the aging level relative to the organic EL element included in the pixels is moderated, is obtained.

The display device according to the embodiments described above mainly includes the following configuration.

A display device according to one aspect of the embodiments described above is a display device includes: an emission element which is provided in the emission panel; a power supply which supplies power to the emission element; a pixel circuit which is provided in a power supply path between the emission element and the power supply, and causes a current corresponding to a level of a received brightness signal to flow through the emission element; and a controller which outputs the brightness signal to the pixel circuit, and selectively operates in an aging mode for aging the emission element or in an image display mode for displaying an image using the emission element, wherein the power supply outputs an identical power supply voltage in the aging mode and in the image display mode, and the controller is configured to set a level of the brightness signal, which is output to the pixel circuit in the aging mode, to cause brightness of the emission element in the aging mode to become greater than maximum brightness in the image display mode.

By adopting the foregoing configuration, the brightness of the emission element in the aging mode may be increased, and the maximum brightness of the emission element may be reduced steeply. Thus, the aging time may be shortened. Moreover, in the display device, the controller controls to cause the brightness of the emission element in the aging mode to become greater than maximum brightness in the image display mode. Consequently, the maximum brightness of the emission element is reduced steeply in comparison to the case where the brightness of the emission element in the aging mode is within the range of the image display mode. Hence, the aging time may be reduced. Moreover, in the aging mode and the image display mode, the controller controls the brightness of the emission element, and an external aging device is not used. In addition, the power supply outputs the identical power supply voltage in the aging mode and the image display mode. Hence, there is no need to apply a power supply voltage from an external aging device in the aging mode. Thus, in the manufacturing step of the display device, no time is wasted waiting for the external aging device to become available. Accordingly, with this display device, it is possible to inhibit the deterioration in manufacturing efficiency while shortening the aging time.

In the above display device, the controller may represent the level of the brightness signal as a bit value of a digital signal, and uses a bit number of the digital signal in the aging mode greater than a bit number used in the image display mode.

The above display device may further includes a converter which converts the digital signal into an analog signal, and is provided on a signal transmission path through which the brightness signal is transmitted from the controller to the pixel circuit. The controller may cause the converter to switch the bit number of the digital signal used in the aging mode and in the image display mode.

In the above display device, the controller may make a judgment about either the aging mode or the image display mode in response to an operation signal based on an operation performed by an operator, and may cause the converter to switch the bit number of the digital signal used in the aging mode and in the image display mode based on a result of the judgment.

The aging method of the display panel according to the embodiments described above mainly includes the following configuration.

An aging method of a display panel according to one aspect of the embodiments described above is an aging method of a display panel including emission elements whose luminescent colors are different, the method includes: adjusting a length of an aging period in accordance with brightness deterioration characteristics of each of the emission elements for each of the luminescent colors, and supplying a current to each of the emission elements of the luminescent colors, at least a part of at least two of the aging periods of the emission elements of the luminescent colors being overlapped.

With the foregoing configuration, the length of the aging period, that is, the aging time is adjusted in accordance with brightness deterioration characteristics of each of the emission elements for each of the luminescent colors. Thus, it is possible to inhibit a life of the emission elements from differing as a result of the aging of the emission elements being excessive or insufficient for each luminescent color. Moreover, at least a part of at least two of the aging periods of the luminescent colors is overlapped. Thus, the aging time may be shortened in comparison to a case of sequentially performing aging for each luminescent color. Accordingly, with this aging method of a display panel, the aging time may be shortened while performing aging in consideration of the brightness deterioration characteristics that differ for each luminescent color.

In the foregoing aging method of a display panel, a starting point of the aging period of each of the luminescent colors may be the same.

In the foregoing aging method of a display panel, the brightness deterioration characteristics may be a brightness decreasing rate caused by deterioration in a material itself configuring an emission layer of the emission elements, and the length of the aging period may be shortened as the brightness decreasing rate is greater.

In the foregoing aging method of a display panel, when, at an end of the aging period of any one of the luminescent colors, the aging period of the remainder of the luminescent colors remains, a current supplied to at least one of the emission elements having the remaining aging period may be increased in order to increase a sum of the currents supplied to all of the emission elements having the remaining aging period compared to before the end of the aging period of the any one of the luminescent colors.

In the foregoing aging method of a display panel, the emission element may be an organic EL element.

In addition, a method for manufacturing a display panel according to one aspect of the embodiments described above is a method for manufacturing a display panel including emission elements whose luminescent colors are different, the method includes: an aging step of causing the emission elements to emit light during an aging period of a predetermined length, wherein a current is supplied to each of the emission elements of the luminescent colors in the aging step, at least a part of the aging period of at least two of the emission elements of the luminescent colors being overlapped, and the length of the predetermined aging period is adjusted in accordance with brightness deterioration characteristics of the emission elements for each of the luminescent colors.

The following additions are furthermore disclosed in relation to the embodiments including the modified examples described above.

(Addition 1)

An aging method of a display panel including emission elements whose luminescent colors are different, the method comprising:

adjusting a length of an aging period in accordance with brightness deterioration characteristics of each of the emission elements for each of the luminescent colors, and supplying a current to each of the emission elements of the luminescent colors, at least a part of at least two of the aging periods of the emission elements of the luminescent colors being overlapped.

(Addition 2)

The aging method of a display panel according to Addition 1, wherein a starting point of the aging period of each of the luminescent colors is the same.

(Addition 3)

The aging method of a display panel according to Addition 1 or 2, wherein the brightness deterioration characteristics is a brightness decreasing rate caused by deterioration in a material itself configuring an emission layer of the emission elements, and the length of the aging period is shortened as the brightness decreasing rate is greater.

(Addition 4)

The aging method of a display panel according to any one of Additions 1 to 3, wherein when, at an end of the aging period of any one of the luminescent colors, the aging period of the remainder of the luminescent colors remains, a current supplied to at least one of the emission elements having the remaining aging period is increased in order to increase a sum of the currents supplied to all of the emission elements having the remaining aging period compared to before the end of the aging period of the any one of the luminescent colors.

(Addition 5)

The aging method of a display panel according to any one of Additions 1 to 4, wherein the emission element is an organic EL element.

(Addition 6)

A method for manufacturing a display panel including emission elements whose luminescent colors are different, the method comprising:

an aging step of causing the emission elements to emit light during an aging period of a predetermined length, wherein a current is supplied to each of the emission elements of the luminescent colors in the aging step, at least a part of the aging period of at least two of the emission elements of the luminescent colors being overlapped, and the length of the predetermined aging period is adjusted in accordance with brightness deterioration characteristics of the emission elements for each of the luminescent colors.

INDUSTRIAL APPLICABILITY

The principle of the various embodiments described above is suitably applied to a display device for displaying images.

The invention claimed is:

1. A method for manufacturing an active-matrix emission panel which has an emission portion including pixels, through which currents of mutually different values flow under a condition that voltages of mutually identical values are applied to the respective pixels, the method comprising:

applying a predetermined reference voltage to all of the pixels simultaneously, and measuring brightness values of the respective pixels to obtain measurement values;

obtaining values of current flowing through the respective pixels based on the measurement values and a relation between the brightness values and current values of the pixels;

calculating, based on the values of current and the predetermined reference voltage, correction coefficients for correcting the values of the voltages applied to the respective pixels to reduce differences among the values of current flowing through the respective pixels;

selectively operating the active-matrix emission panel in an aging mode for aging the pixels or in an image display mode for displaying an image; and in the aging mode, executing aging processing on the pixels, the aging processing being executed by correcting the values of the voltages applied to the respective pixels using the correction coefficients and by applying the corrected voltages to the respective pixels, wherein, in the aging processing, a brightness of the pixels is set to be greater than a maximum brightness in the image display mode.

2. The method according to claim 1, further comprising: storing the correction coefficients calculated in the calculating as table data in which the pixels and the correction coefficients are associated with each other; and acquiring the correction coefficients from the table data.

3. The method according to claim 1, further comprising: calculating and storing a correction function representing the correction coefficients calculated in the calculating with respect to positions of the respective pixels in the emission portion, wherein the correction coefficients are calculated from the positions of the respective pixels in the emission portion and the correction function.

4. The method according to claim 1, wherein the values of current flowing through the pixels are respectively further measured in the applying.

5. The method according to claim 1, wherein the emission portion includes a first pixel and a second pixel as the pixels, the first pixel and the second pixel being disposed at mutually different positions, the first pixel is connected to a circuit board via a first conducting wire, the circuit board applying voltages to the pixels, the second pixel is connected to the circuit board via a second conducting wire shorter than the first conducting wire, and the correction coefficients calculated in the calculating are determined for one of the values of the voltages applied to the first pixel to become higher than one of the values of the voltages applied to the second pixel.

6. The method according to claim 1, wherein each of the pixels includes an organic EL element.

7. A display device which includes an active-matrix emission panel manufactured by the manufacturing method according to claim 1, the display device comprising:

an emission element which is provided in the active-matrix emission panel;

a power supply which supplies power to the emission element;

a pixel circuit which is provided in a power supply path between the emission element and the power supply, and causes a current corresponding to a level of a received brightness signal to flow through the emission element; and a controller which outputs the brightness signal to the pixel circuit, and selectively operates in the aging mode for aging the emission element or in the image display mode for displaying the image using the emission element, wherein the power supply outputs an identical power supply voltage in the aging mode and in the image display mode, and the controller is configured to set a level of the brightness signal, which is output to the pixel circuit in the aging mode, to cause the brightness of the pixels in the aging mode to be greater than the maximum brightness in the image display mode.

8. The display device according to claim 7, wherein the controller represents the level of the brightness signal as a bit value of a digital signal, and uses a bit number of the digital signal in the aging mode greater than a bit number used in the image display mode.

9. The display device according to claim 8, further comprising:

a converter which converts the digital signal into an analog signal, and is provided on a signal transmission path through which the brightness signal is transmitted from the controller to the pixel circuit, wherein the controller causes the converter to switch the bit number of the digital signal used in the aging mode and in the image display mode.

10. The display device according to claim 9, wherein the controller makes a judgment about either the aging mode or the image display mode in response to an operation signal based on an operation performed by an operator, and causes the converter to switch the bit number of the digital signal used in the aging mode and in the image display mode based on a result of the judgment.

11. The method according to claim 1, wherein the correction coefficients are each calculated for a pixel block including a plurality of the pixels, the measurement values of the plurality of the pixels in each pixel block being averaged to obtain average values, the correction coefficients being calculated based on the average values and the predetermined reference voltage.

12. A method for manufacturing an emission panel which has an emission portion including pixels, through which currents of mutually different values flow under a condition that voltages of mutually identical values are applied to the respective pixels, the method comprising:

applying a predetermined reference voltage to all of the pixels simultaneously, and measuring brightness values of the respective pixels to obtain measurement values;

obtaining values of current flowing through the respective pixels based on the measurement values and a relation between the brightness values of the pixels and current values of the pixels;

calculating correction coefficients for correcting the values of the voltages applied to the respective pixels to reduce differences among the values of current flowing through the respective pixels based on the obtained values of current and the predetermined reference voltage;

acquiring the correction coefficients; and executing aging processing on the pixels, the aging processing being executed by correcting the values of the voltages applied to the respective pixels using the correction coefficients and by applying the corrected voltages to the respective pixels.

13. A method for manufacturing an active-matrix emission panel which has an emission portion including pixels, through which currents of mutually different values flow under a condition that voltages of mutually identical values are applied to the respective pixels, the method comprising:

measuring brightness values of the respective pixels to obtain measurement values;

obtaining values of current flowing through the respective pixels based on the measurement values and a relation between the brightness values and current values of the pixels;

acquiring, based on the values of current, correction coefficients for correcting the values of the voltages applied to the respective pixels to reduce differences among the values of current flowing through the respective pixels; and executing aging processing on the pixels, the aging processing being executed by correcting the values of the voltages applied to the respective pixels using the correction coefficients and by applying the corrected voltages to the respective pixels, wherein the correction coefficients are each calculated for a pixel block including a plurality of the pixels, the values of current of the plurality of the pixels in each pixel block being averaged to obtain average values, the correction coefficients being calculated based on the average values.

* * * * *